US012750969B2

(12) United States Patent
Tsorng et al.

(10) Patent No.: US 12,750,969 B2
(45) Date of Patent: Sep. 29, 2026

(54) ADAPTER BRACKET FOR SERVER MAINBOARD MODULE

(71) Applicant: QUANTA COMPUTER INC., Taoyuan City (TW)

(72) Inventors: Yaw-Tzorng Tsorng, Taoyuan City (TW); Tung-Hsien Wu, Taoyuan City (TW); Yu-Ying Tseng, Taoyuan City (TW); Yen-Lin Liu, Taoyuan City (TW)

(73) Assignee: QUANTA COMPUTER INC., Taoyuan City (TW)

(*) Notice: Subject to any disclaimer, the term of this patent is extended or adjusted under 35 U.S.C. 154(b) by 434 days.

(21) Appl. No.: 18/371,904

(22) Filed: Sep. 22, 2023

(65) Prior Publication Data

US 2025/0107031 A1 Mar. 27, 2025

(51) Int. Cl.
*G06F 1/16* (2006.01)
*H05K 5/00* (2025.01)
*H05K 7/00* (2006.01)
*H05K 7/14* (2006.01)

(52) U.S. Cl.
CPC ......... *H05K 7/1489* (2013.01); *H05K 7/1407* (2013.01)

(58) Field of Classification Search
CPC .. H05K 7/1489; H05K 7/1407; H05K 7/1488; H05K 7/1402; H05K 7/1405
See application file for complete search history.

(56) References Cited

U.S. PATENT DOCUMENTS

| | | | | |
|---|---|---|---|---|
| 4,688,148 A * | 8/1987 | Mallory | H05K 7/1417 | 361/740 |
| 5,499,163 A * | 3/1996 | Sonntag | H05K 7/142 | 361/752 |
| 7,581,959 B2 * | 9/2009 | Christensen | H05K 7/1409 | 439/259 |
| 8,248,817 B2 * | 8/2012 | Yeh | H05K 7/142 | 361/752 |
| 10,736,228 B2 * | 8/2020 | Kho | G11B 33/142 | |
| 2012/0145723 A1 * | 6/2012 | Chiu | H05K 7/142 | 220/660 |
| 2021/0360812 A1 * | 11/2021 | Chen | G06F 1/185 | |

FOREIGN PATENT DOCUMENTS

| | | |
|---|---|---|
| CN | 101198237 A | 6/2008 |
| CN | 104360718 A | 2/2015 |
| TW | 551026 B | 9/2003 |

* cited by examiner

*Primary Examiner* — Anthony M Haughton
(74) *Attorney, Agent, or Firm* — WPAT, PC

(57) ABSTRACT

The present disclosure provides an adapter bracket, which includes a first portion, a second portion and a third portion. The first portion includes a protruding portion extending from a first bottom surface of the first portion in a direction perpendicular to the first bottom surface. The second portion, has an elevation with respect to the first bottom surface of the first portion. The second portion comprising a first hole. The third portion extends between the first portion and the second portion.

18 Claims, 24 Drawing Sheets

120

500

ADAPTER BRACKET FOR SERVER MAINBOARD MODULE

FIELD OF THE INVENTION

The present disclosure relates to server devices, and, in particular, to an adapter bracket and an electronic device.

BACKGROUND

Various electronic components, such as a central processing unit (CPU), memory, storage device, graphics processing unit, and network card, are integrated ton a mainboard of a server device (i.e., referred to as a server mainboard). In the Open Compute Project (OCP) standard, one or more zero-height keep-out zones are defined on the bottom surface of the server mainboard, which cannot be modified. In the manufacturing of server devices, server mainboards are usually of different thickness, sizes, and types, and they cannot be assembled in the same type of chassis due to the limitation of the zero-height keep-out zone.

SUMMARY OF THE DISCLOSURE

Thus, an adapter bracket and an electronic device are provided to solve the aforementioned problem.

In an aspect of the present disclosure, an adapter bracket is provided, which includes a first portion, a second portion and a third portion. The first portion includes a protruding portion extending from a first bottom surface of the first portion in a direction perpendicular to the first bottom surface. The second portion, has an elevation with respect to the first bottom surface of the first portion. The second portion comprises a first hole. The third portion extends between the first portion and the second portion.

In another aspect of the present disclosure, an electronic device is provided, which includes a chassis, a mainboard module, and an adapter bracket. The mainboard module includes a mainboard mounting plate and a mainboard mounted to the mainboard mounting plate. The adapter bracket is mounted on the chassis. The mainboard module is mounted to the chassis via the adapter bracket by sliding the mainboard module along a first direction perpendicular to a normal of a top surface of the chassis.

BRIEF DESCRIPTION OF THE DRAWINGS

Aspects of the present disclosure are best understood from the following detailed description when read with the accompanying figures. It is noted that in accordance with the standard practice in the industry, various features are not drawn to scale. In fact, the dimensions of the various features may be arbitrarily increased or reduced for clarity of discussion.

DETAILED DESCRIPTION

Figure 1A:
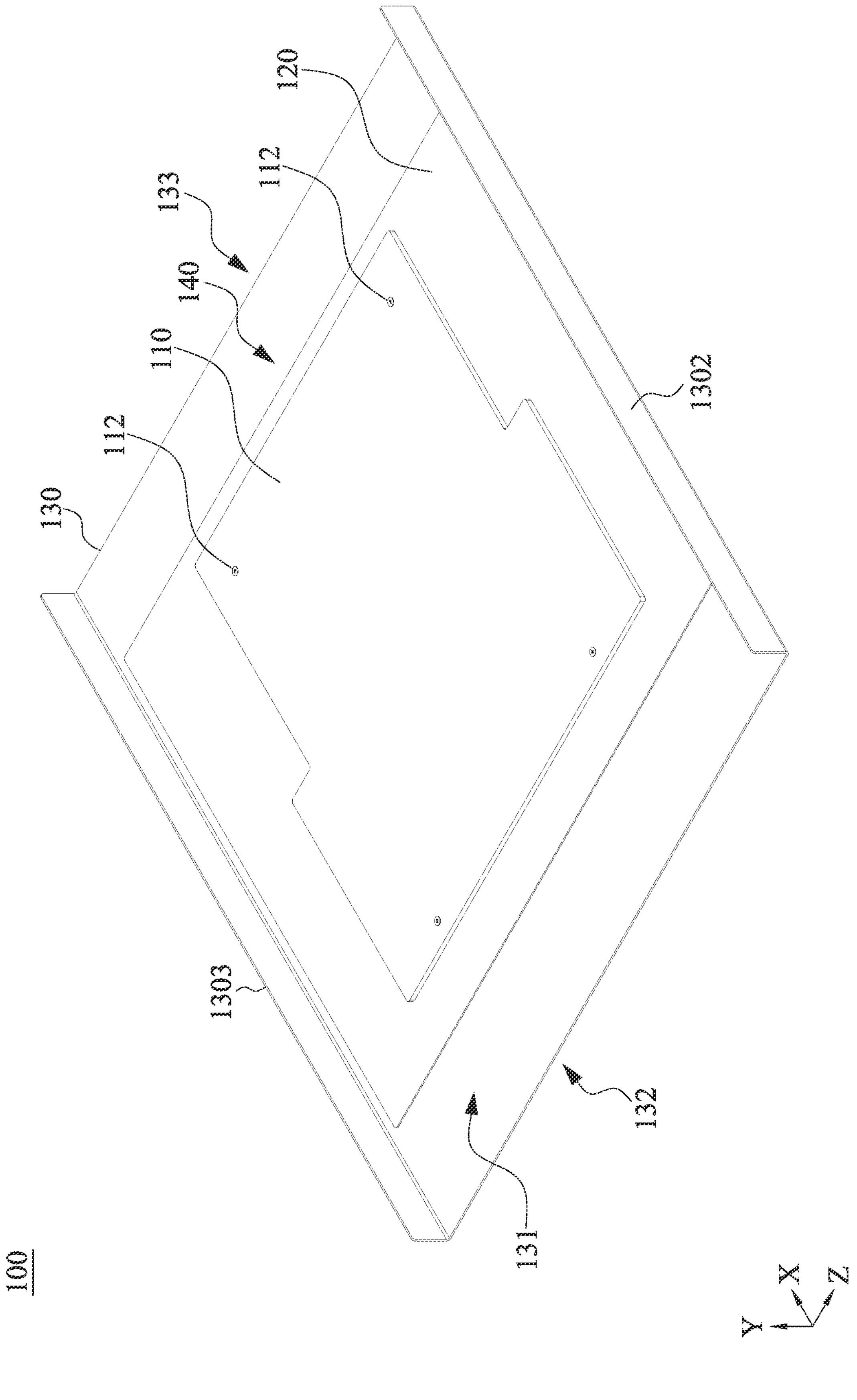
FIG. 1A is a perspective view of a server device in accordance with an embodiment of the present disclosure.

The following disclosure provides many different embodiments, or examples, for implementing different features of the provided subject matter. Specific examples of operations, components, and arrangements are described below to simplify the present disclosure. These are, of course, merely examples and are not intended to be limiting. For example, a first operation performed before or after a second operation in the description may include embodiments in which the first and second operations are performed together, and may also include embodiments in which additional operations may be performed between the first and second operations. For example, the formation of a first feature over, on or in a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Time relative terms, such as "prior to," "before," "posterior to," "after" and the like, may be used herein for ease of description to describe the relationship of one operation or feature to another operation(s) or feature(s) as illustrated in the figures. Such time relative terms are intended to encompass different sequences of the operations depicted in the figures. Further, spatially relative terms, such as "beneath," "below," "lower," "above," "upper" and the like, may be used herein for ease of description to describe the relationship of one element or feature to another element(s) or feature(s) as illustrated in the figures. Such spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Relative terms for connections, such as "connect," "connected," "connection," "couple," "coupled," "in communication," and the like, may be used herein for ease of description to describe an operational connection, coupling, or linking one between two elements or features. The relative terms for connections are intended to encompass different connections, couplings, or linkings of the devices or components. The devices or components may be directly or indirectly connected, coupled, or linked to one another through, for example, another set of components. The devices or components may be connected, coupled, or linked with each other by wire and/or wirelessly.

As used herein, the singular terms "a," "an," and "the" may include plural referents unless the context clearly indicates otherwise. For example, reference to a device may include multiple devices unless the context clearly indicates otherwise. The terms "comprising" and "including" may indicate the existences of the described features, integers, steps, operations, elements, and/or components, but may not exclude the existence of combinations of one or more of the features, integers, steps, operations, elements, and/or components. The term "and/or" may include any or all combinations of one or more listed items.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

The nature and use of the embodiments are discussed in detail as follows. It should be appreciated, however, that the present disclosure provides many applicable inventive concepts that can be embodied in a wide variety of specific contexts. The specific embodiments discussed are merely illustrative of specific ways to embody and use the disclosure, without limiting the scope thereof.

Figure 1B:
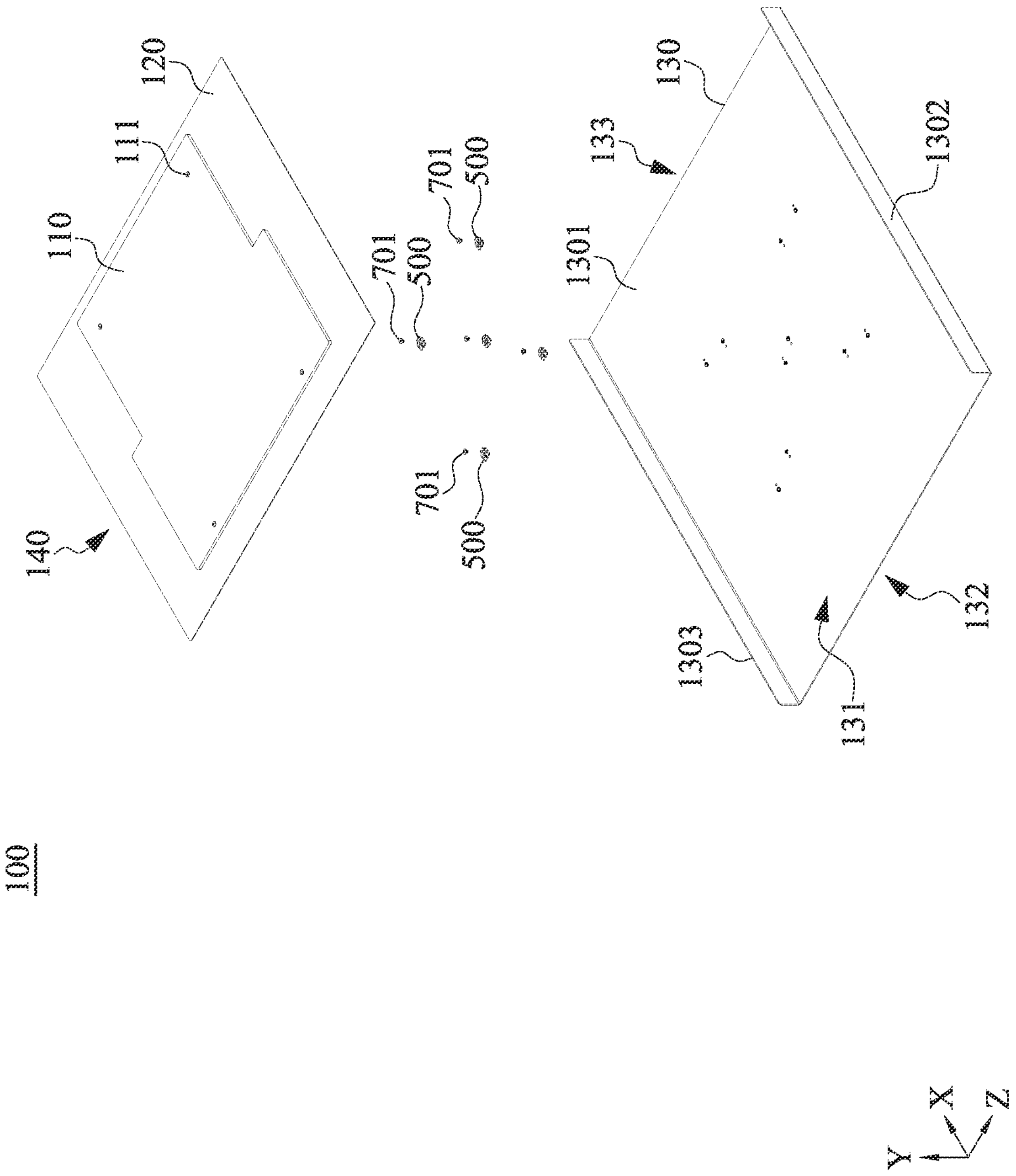
FIG. 1B is an exploded view of a server device in accordance with an embodiment of the present disclosure.

FIG. 1A is a perspective view of a server device 100 in accordance with an embodiment of the present disclosure. FIG. 1B is an exploded view of the server device 100 in FIG. 1A.

In some implementations, the server device 100 may be a part of a rack system. In some other implementations, the server devices 100 can be stacked vertically or horizontally together. As depicted in FIG. 1A, the server device 100 may include a mainboard 110, a mainboard mounting plate 120, and a chassis 130. In some implementations, the server device 100 may further include a plurality of power-supply modules, a plurality of fan modules, and a storage array module, which are not shown in FIG. 1A for simplicity.

The chassis 130 may be formed in a shape of a cuboid and mounted in a rack (not shown for simplicity). The chassis 130 may include an accommodation space 131, a first opening 132, and a second opening 133, wherein the first opening 132 and the second opening 133 may be located at two opposite ends of the accommodation space 131. The accommodation space 131 may be connected to the outer space of the chassis 130 through the first opening 132 and the second opening 133. The chassis 130 may include a base plate 1301 and side walls 1302 and 1303, wherein the side walls 1302 and 1303 may extend from two opposite sides of the base plate 1302, as shown in FIG. 1B. In some implementations, the chassis 130 may further include a top cover which is not shown for simplicity.

The mainboard 110 (also known as motherboard, system board, planar board, or logic board) is a main printed circuit board (PCB) found in computers and other expandable systems. The mainboard 110 may hold and allow communication between many electronic components of a computer system, such as a central processing unit (CPU) and a memory, and provide connectors for other peripherals.

The mainboard mounting plate 120 may be made of material, such as metal or the like, which has sufficient structural strength to stably support the mainboard 110. In some implementation, the mainboard 110 is mounted on the mainboard mounting plate 120 to form a mainboard module 140 via a plurality of fasteners 112, such as screws or bolts, so as to enhance the structural strength of the mainboard 110.

The mainboard module 140 may be disposed in the accommodation space 131 of the chassis 130, and it may be located at the middle region between the first opening 132 and the second opening 133. In some implementations, the mainboard module 140 can be plugged into the chassis 130 along the Y-axis direction or unplugged from the chassis 130 via the first opening 132 or the second opening 133. In some implementations, the mainboard module 140 may be inserted into the chassis 130 along the X-axis direction via the first opening 132 or the second opening 133.

In some implementations, the mainboard module 140 (i.e., mainboard 110 plus the mainboard mounting plate 120) is mounted on the chassis 130 using the fasteners 701 through the adapter bracket 500, as depicted in FIG. 1B.

Figure 2A:
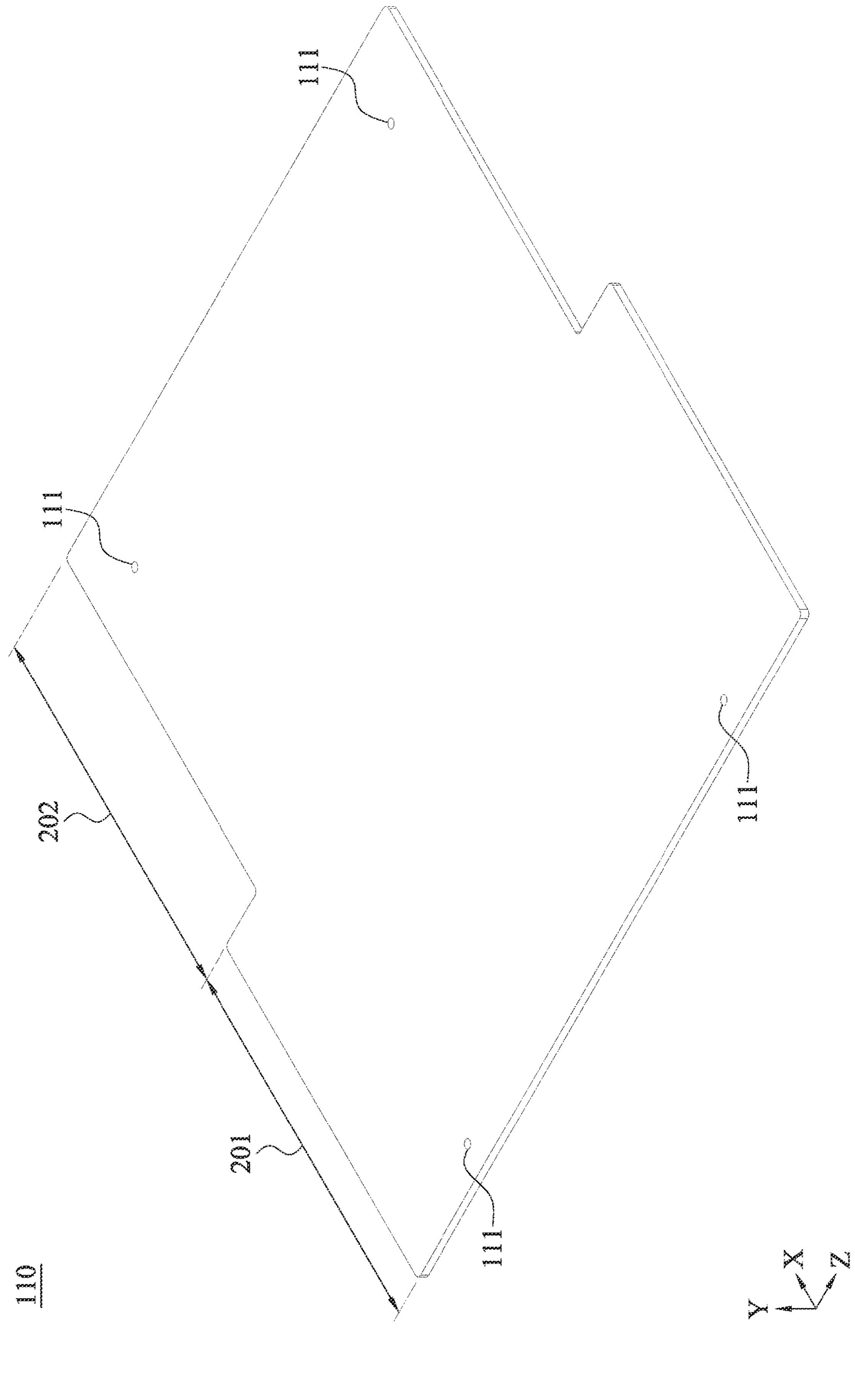
FIG. 2A is a perspective view of a mainboard in accordance with an embodiment of the present disclosure.
Figure 2B:
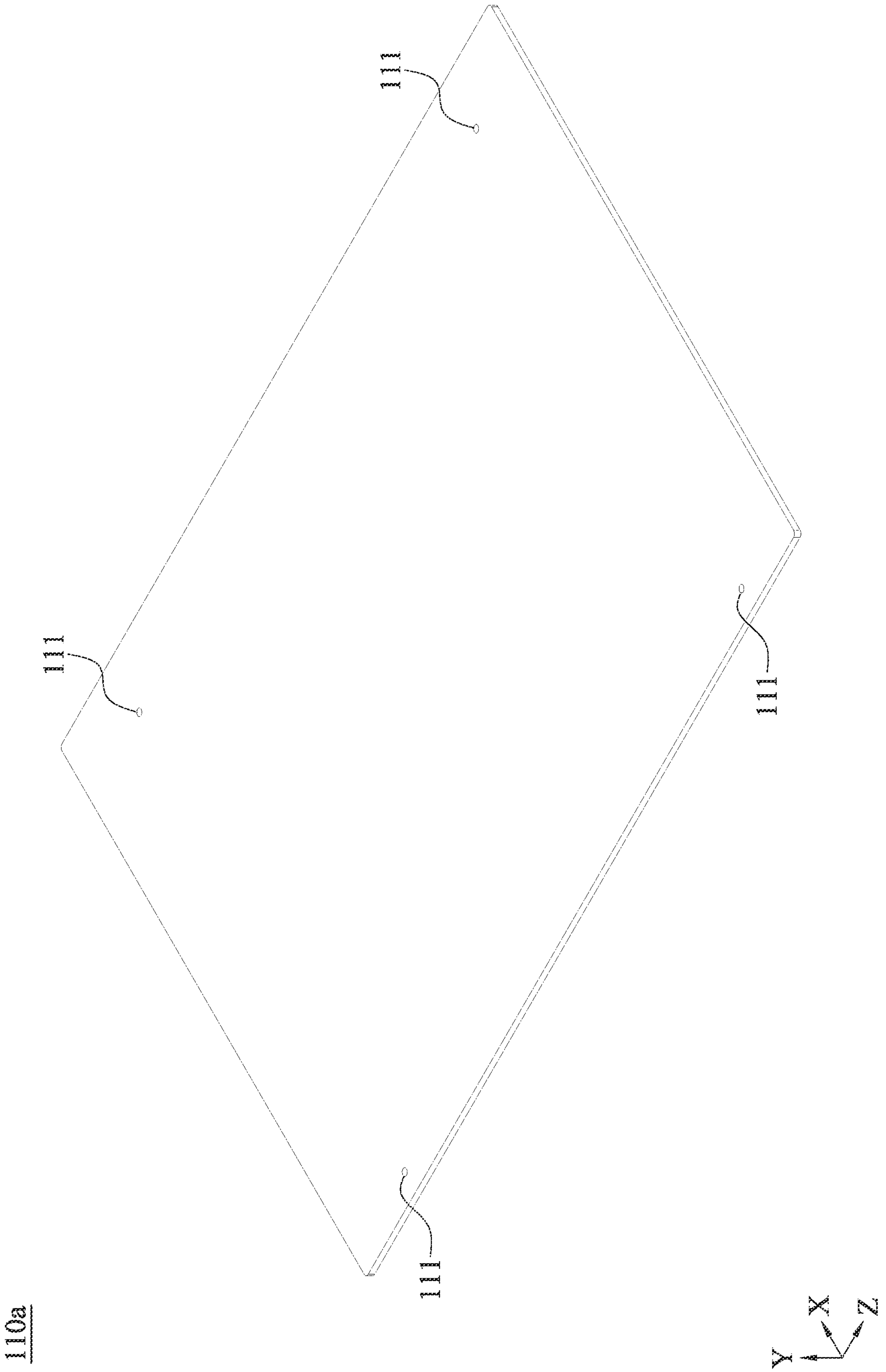
FIG. 2B is a perspective view of a mainboard in accordance with another embodiment of the present disclosure.
Figure 2C:
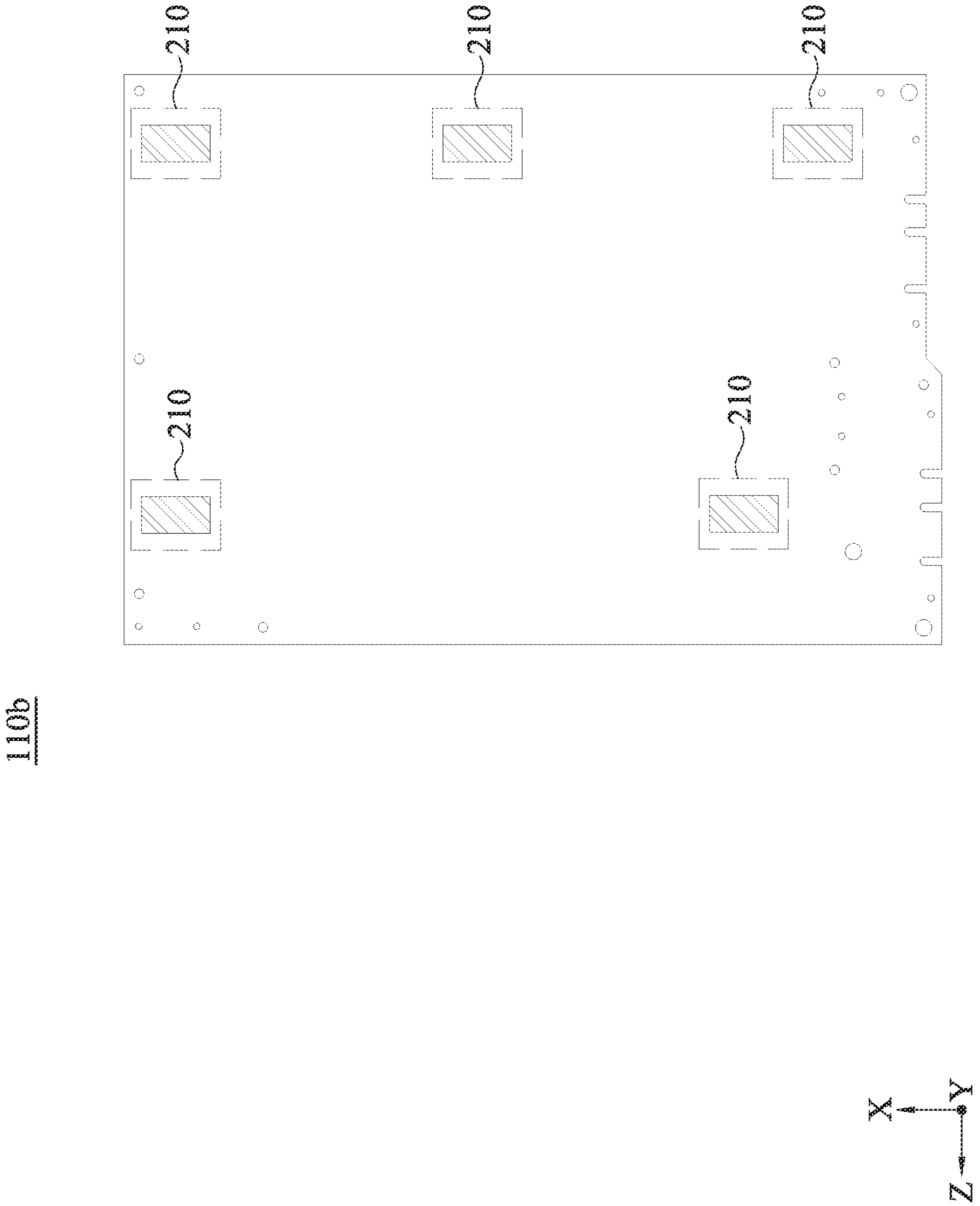
FIG. 2C is a bottom view of a mainboard in accordance with yet another embodiment of the present disclosure.

FIG. 2A is a perspective view of the mainboard 110 in accordance with an embodiment of the present disclosure. FIG. 2B is a perspective view of the mainboard 110*a* in accordance with another embodiment of the present disclosure. FIG. 2C is a bottom view of the mainboard 110*b* in accordance with yet another embodiment of the present disclosure.

In some implementations, the size, shape, and thickness of the mainboard 110 may vary depending on practical designs of the mainboard 110. For example, the mainboard 110 may be divided into regions 201 and 202, as shown in FIG. 2A. Region 202 may extend from region 201. The dimension of region 202 along the X axis may be substantially equal to that of region 201. The dimension of region 202 along the Z axis may be narrower than that of region 201, as shown in FIG. 2A. A plurality of screw holes 111 may be on the mainboard 110. For purposes of description, four screw holes 111 are shown in FIG. 2A. Two screw holes 111 may be disposed on a first side of the mainboard 110, and the other two screw holes 111 may be disposed on a second side of the mainboard 110, wherein the second side is opposite to the first side.

In another embodiment, the mainboard 110*a* may be a rectangular-shaped printed circuit board including various electronic components disposed thereon, as shown in FIG. 2B. Similarly, two screw holes 111 may be disposed on a first side of the mainboard 110*a*, and the other two screw holes 111 may be disposed on a second side of the mainboard 110*a*, wherein the second side is opposite to the first side.

FIG. 2C is a bottom view of the mainboard 110*b*. In some implementations, the size, shape, and thickness of the mainboard 110 may follow the Open Compute Project (OCP) standard, which is a collaborative community focused on redesigning hardware technology to efficiently support the growing demands on compute infrastructure. In addition, The OCP Server Project provides standardized server system specifications for scale computing. Standardization is key to ensure that the OCP specification pool does not get fragmented by point solutions that plague the industry today. The Server Project collaborates with the other OCP disciplines to ensure broad adoption and achieve optimizations throughout all aspects from validation, to manufacturing, deployments, data center operations, and de-commissioning.

In some implementations, a plurality of keep-out zones (KOZs) 210 may be defined on the bottom surface of the mainboard 110*b* based on the OCP standard. No electronic components are allowed to be disposed on the keep-out zones 210 of the bottom surface of the mainboard 110 except metal wires. Specifically, installation of the mainboard module 140 may include a sliding operation along the X-axis direction so the mainboard module 140 can be fastened by the adapter bracket 500 (i.e., shown in FIG. 5A) to limit displacement along the Z-axis direction. In some implementations, since the adapter bracket 500 may have a certain height, the positions of the adapter bracket 500 installed on the base plate 1301 may correspond to those of the keep-out zones 210.

Figure 3A:
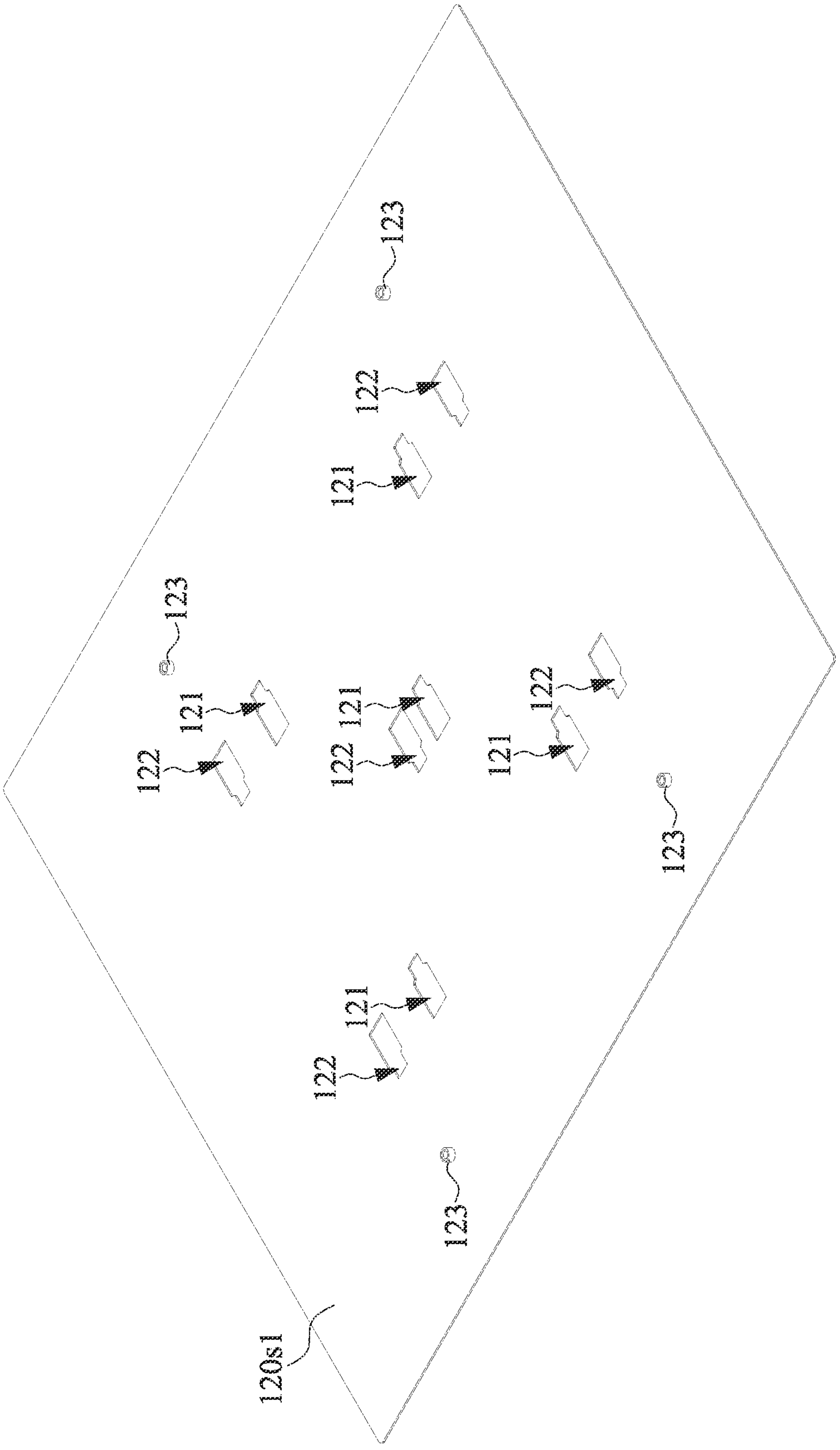
FIG. 3A is a top perspective view of a mainboard mounting plate in FIG. 1 in accordance with an embodiment of the present disclosure.
Figure 3B:
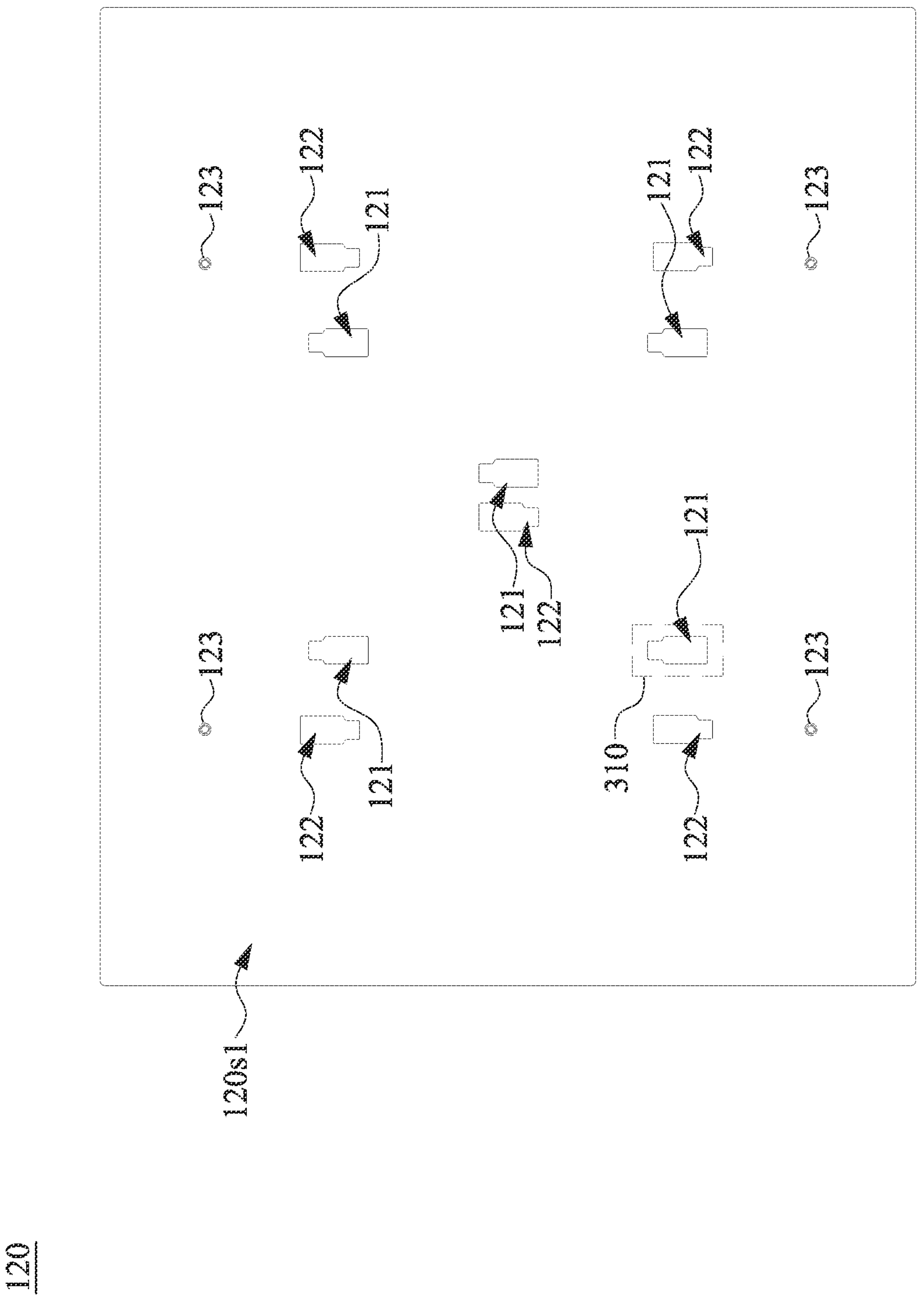
FIG. 3B is a top view of the mainboard mounting plate in FIG. 1 in accordance with an embodiment of the present disclosure.
Figure 3C:
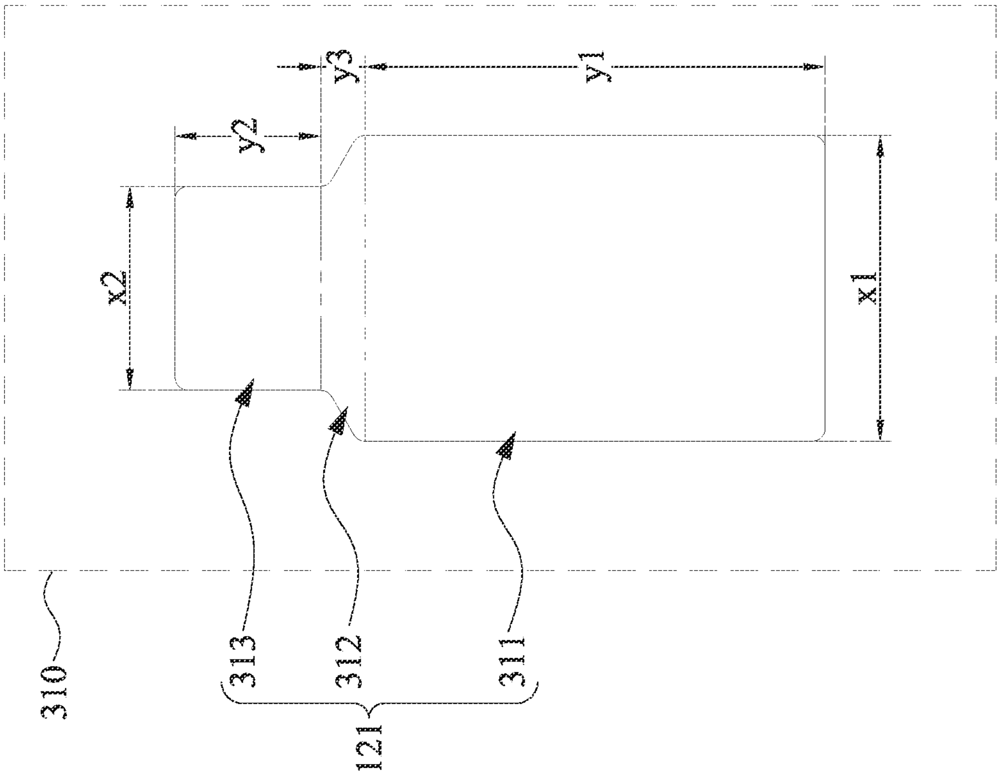
FIG. 3C is an enlarged view of block 310 in FIG. 3B in accordance with an embodiment of the present disclosure.

FIG. 3A is a top perspective view of the mainboard mounting plate 120 in accordance with the embodiment of FIG. 1. FIG. 3B is a top view of the mainboard mounting plate 120 in accordance with the embodiment of FIG. 1. FIG. 3C is an enlarged view of block 310 in FIG. 3B.

In some implementations, a plurality of first holes 121 and a plurality of second holes 122 may be formed on the mainboard mounting plate 120, and a plurality of nut members 123 may be installed on the top surface 120*s*1 of the mainboard mounting plate 120, as shown in FIGS. 3A-3B. The top surface 120*s*1 is a surface of the mainboard mounting plate 120 which directly faces the mainboard 110 in an installation state of the mainboard module 140. In some implementations, the nut members 123 may be staked, bonded, or welded on the top surface 120*s*1 of the mainboard mounting plate 120, but the present disclosure is not limited thereto.

FIG. 3C illustrates an enlarged view of block 310 in FIG. 3B. For example, the first hole 121 in block 310 may include a first portion 311, a second portion 312, and a third portion 313. The first portion 311 may be a rectangular-shape hole having a first width x1 and a first length y1. The second portion 312 communicates with the first portion 311 and may be a trapezoid-shape hole. The second portion 312 may have a third length y3. Two intersection points of the first portion 311 and second portion 312 are spaced by the first width x1, and two intersection points of the first portion 311 and third portion 313 are spaced by a second width x2, as depicted in FIG. 3B. The third portion 313 may be a rectangular-shaped hole extending from the second portion 312, and it may have the second width x2 and a second length y2. The first width x1 is wider than the second width x2. The first length y1 is greater than the second length y2, and the second length y2 is greater than the third length y3.

In some implementations, each of the first holes 121 may have a corresponding second hole 122. The orientation of the second hole 122 may be opposite to that of the first hole 121. More specifically, the first hole 121 in block 310 may be designed for installing the mainboard module 140 on the chassis 130 by sliding the mainboard module 140 along a positive direction of the X axis. The second hole 122 next to the first hole 121 in block 310 may be designed for installing the mainboard module 140 on the chassis 130 by sliding the mainboard module 140 along a negative direction of the X axis. Depending on the installing direction of the mainboard 110, the first holes 121 or the second holes 122 of the mainboard mounting plate 120 can be used.

In some implementations, the positions of holes 111 on the mainboard 110 shown in FIG. 1B may correspond to those of the nut members 123 disposed on the mainboard mounting plate 120. In some implementations, for purposes of description, there are five sets of the first hole 121 and second hole 122 formed on the mainboard mounting plate 120, as shown in FIG. 3A. Four sets of the first hole 121 and second hole 122 may be formed on four corners of the mainboard mounting plate 120, and the other set of the first hole 121 and second 122 may be formed on the center of the mainboard mounting plate 120.

Figure 4A:
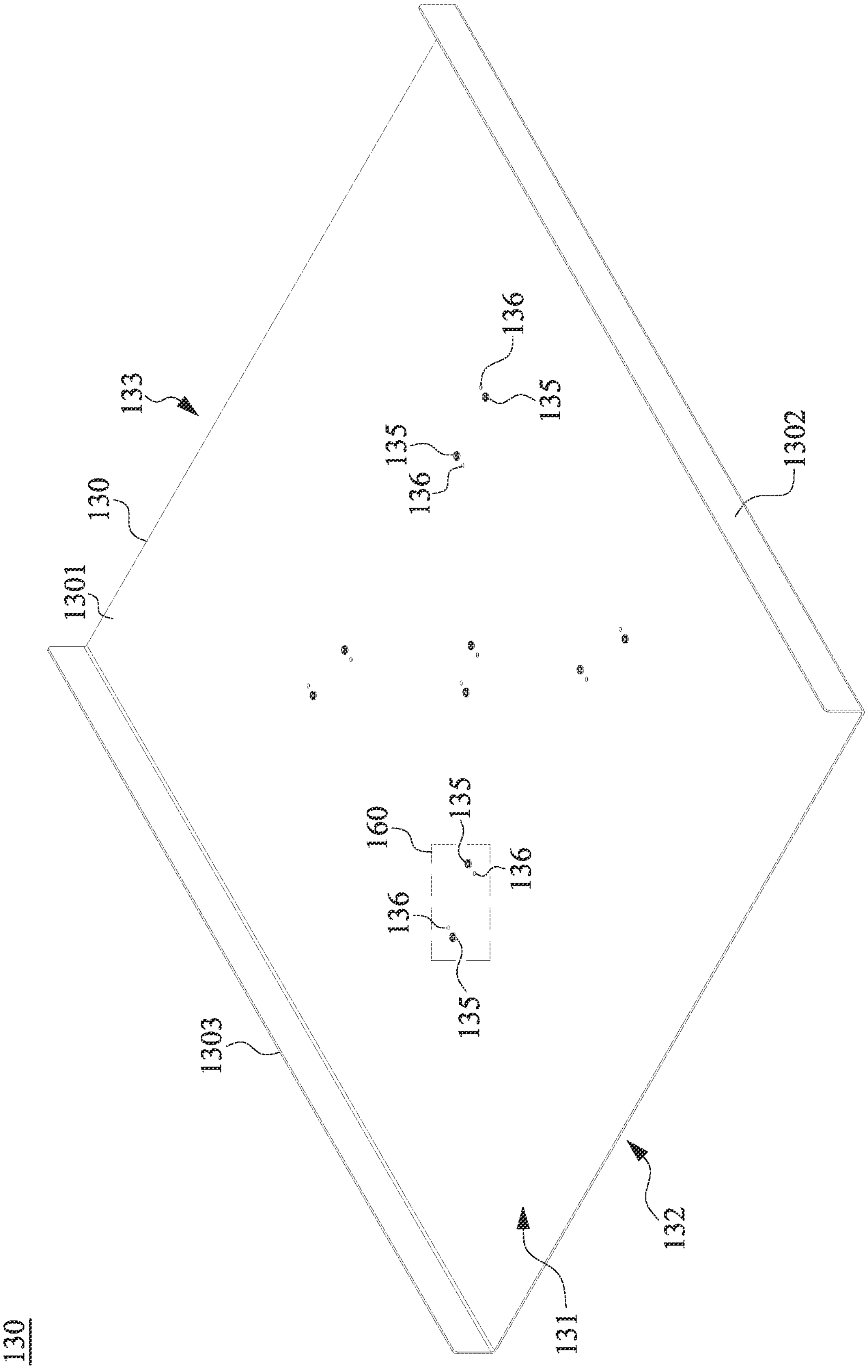
FIG. 4A is a top perspective view of a chassis in FIG. 1 in accordance with an embodiment of the present disclosure.
Figure 4B:
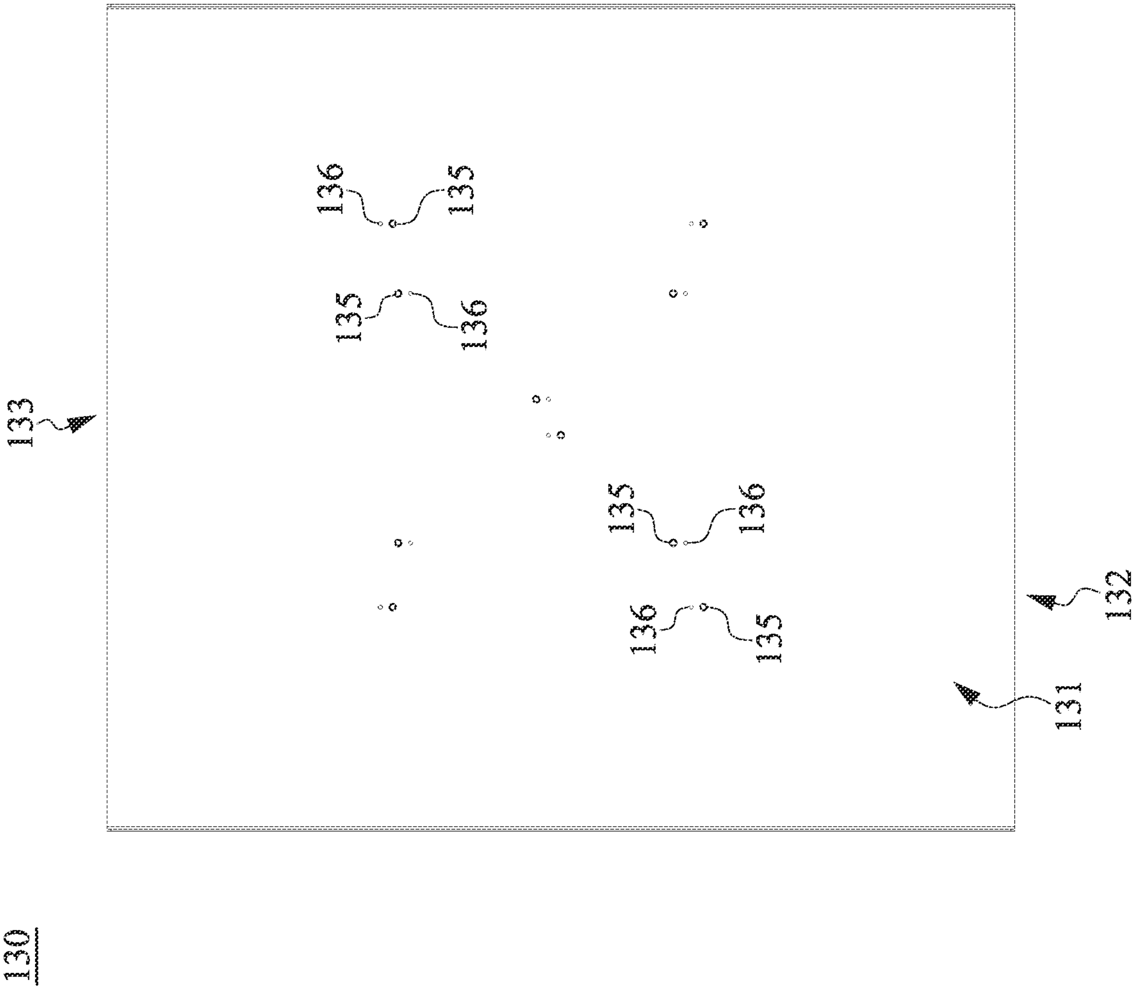
FIG. 4B is a top view of the chassis in FIG. 1 in accordance with an embodiment of the present disclosure.
Figure 4C:
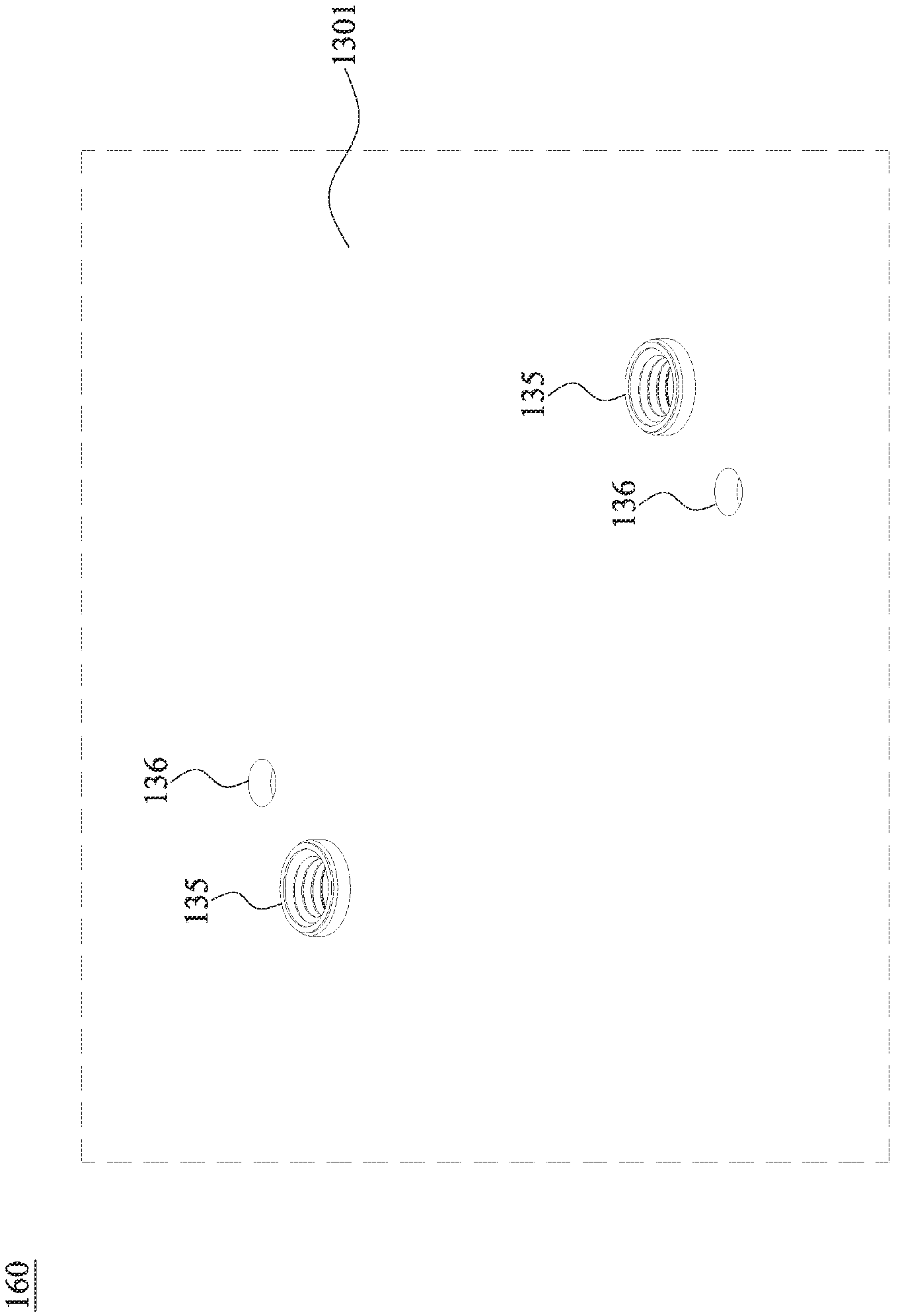
FIG. 4C is an enlarged perspective view of block 160 in FIG. 4A in accordance with an embodiment of the present disclosure.

FIG. 4A is a top perspective view of the chassis 130 in FIG. 1. FIG. 4B is a top perspective view of the chassis 130 in FIG. 1. FIG. 4C is an enlarged perspective view of block 160 in FIG. 4A.

In some implementations, the chassis 130 may be formed in a shape of a cuboid and mounted in a rack (not shown for simplicity).

In some implementations, a plurality of nut members 135 may be disposed on the base plate 1301 of the chassis 130. As shown in FIG. 4C, which shows an enlarged view of block 160 in FIG. 4A, the nut members 135 may be installed on top surface of the base plate 1301 of the chassis 130. The nut members 135 may be staked, bonded, or welded in a through hole, but the present disclosure is not limited thereto. In addition, as shown in FIGS. 4A-4C, the chassis 130 further includes a plurality of positioning holes 136. Each of the positioning holes 136 is positioned adjacent to the nut members 135. The nut members 135 and the positioning holes 136 are configured to facilitate the installation of the adapter bracket 500 on the chassis 130. It should be noted that there are also five sets of the nut member 135 and positioning hole 136 disposed on the base plate 1301 of the chassis 130, as shown in FIG. 4A. The positions of the five sets of the nut member 135 and positioning hole 136 may correspond to the positions of the five sets of the first hole 121 and second hole 122 being used. Five adapter brackets 500 can be first mounted to the five sets of the nut member 135 and positioning hole 136 having the same orientation. While the mainboard module 140 is mounted on the base plate 1301 of the chassis 130, the five adapter brackets 500 will pass through the corresponding first holes 121 or second holes 122, depending on the direction of the sliding operation during the installation procedure for the mainboard module 140. Detailed descriptions regarding the installation method will be described later.

Figure 5A:
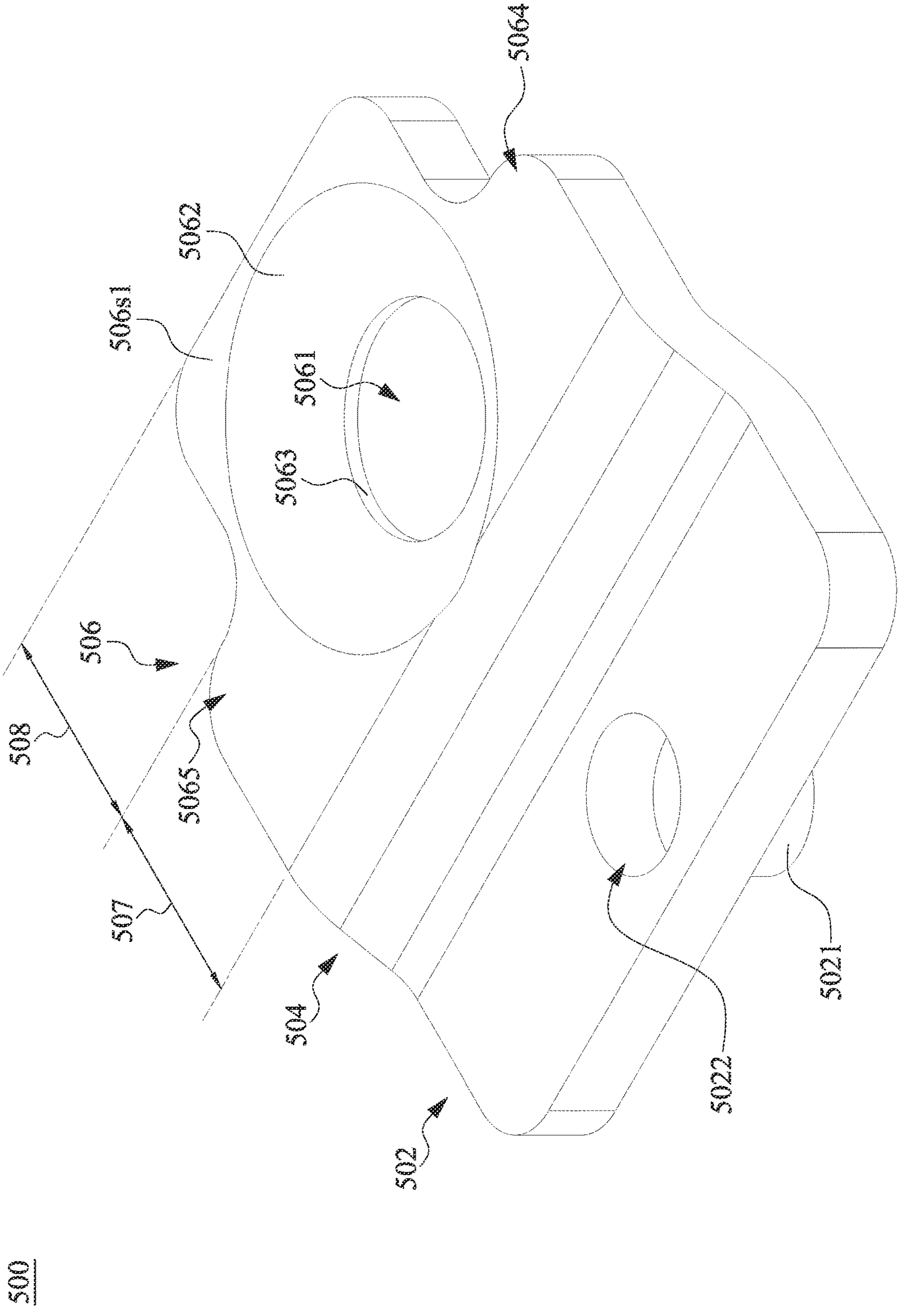
FIG. 5A is a top perspective view of an adapter bracket in accordance with an embodiment of the present disclosure.
Figure 5B:
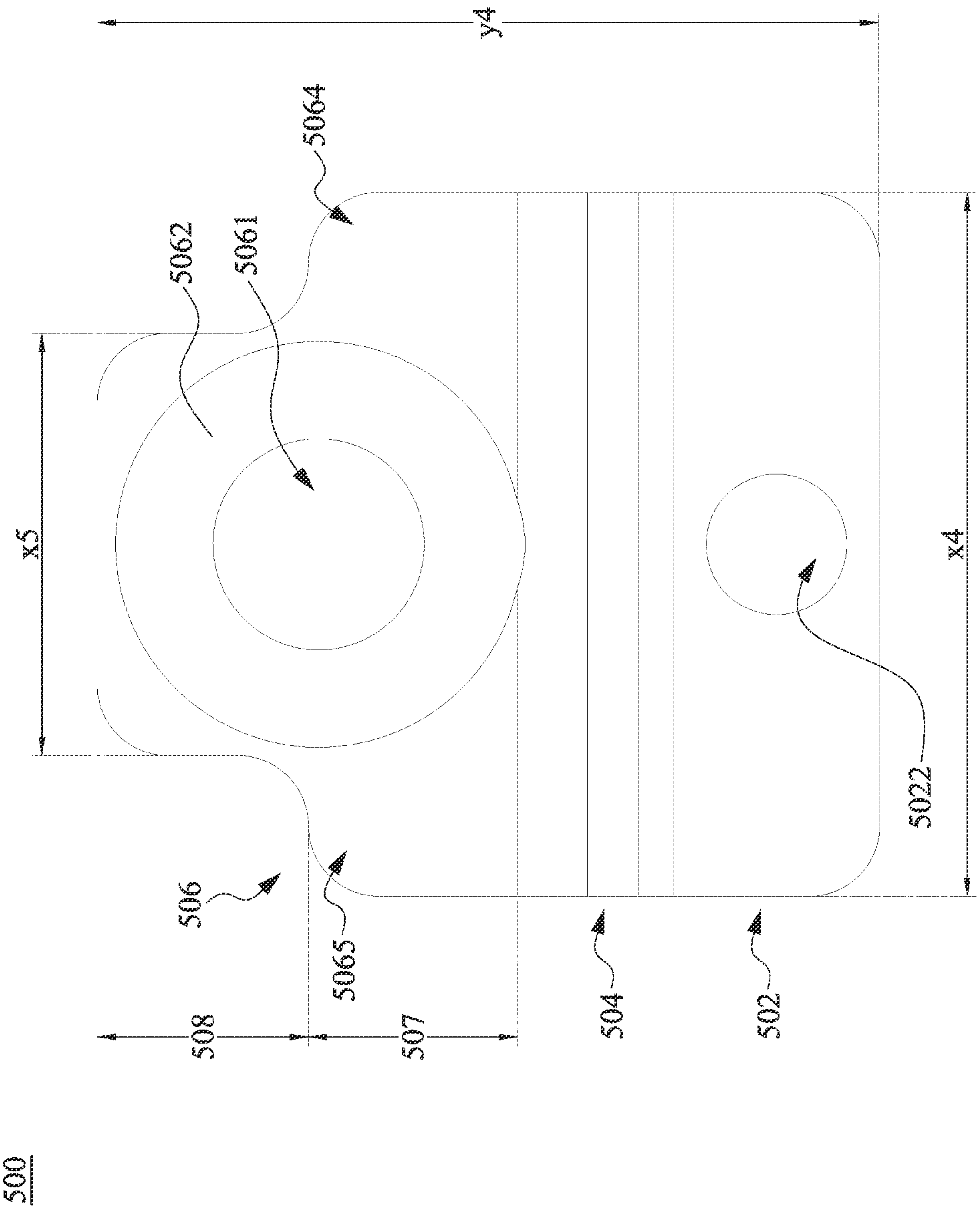
FIG. 5B is a top view of the adapter bracket in FIG. 5A in accordance with an embodiment of the present disclosure.
Figure 5C:
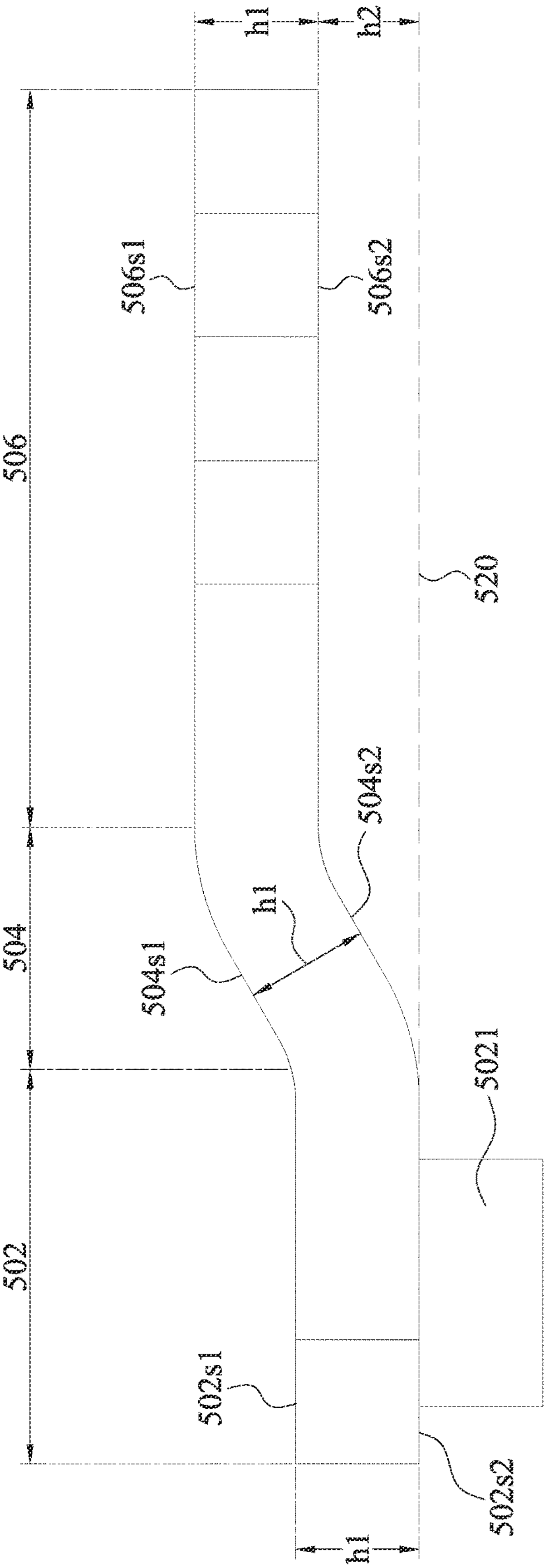
FIG. 5C is a side view of the adapter bracket in FIG. 5A in accordance with an embodiment of the present disclosure.

FIG. 5A is a top perspective view of an adapter bracket 500 in accordance with an embodiment of the present disclosure. FIG. 5B is a top view of the adapter bracket 500 in FIG. 5A. FIG. 5C is a side view of the adapter bracket 500 in FIG. 5A.

In some implementations, the adapter bracket 500 may be made of copper, silver, aluminum, iron, or alloys thereof, but the present disclosure is not limited thereto. The adapter bracket 500 may include portions 502, 504, and 506, as shown in FIGS. 5A to 5C. In some implementations, the portions 502, 504, and 506 may have substantially the same thickness h1, as shown in FIG. 5C. When the adapter bracket 500 is installed on the base plate 1301 of the chassis 130, the bottom surface 502*s*2 (e.g., shown in FIG. 5C) of portion 502 may be in contact with the top surface of the base plate 1031, and the bottom surface 506*s*2 of portion 506 may have an elevation h2 with respect to the bottom surface 502*s*2 (as shown by the dotted line 520 in FIG. 5C) of portion 502. That is, portion 506 is positioned higher than portion 502 when the adapter bracket 500 is installed on the chassis 130. For purposes of illustration, portion 502 is referred to as lower portion, and portion 506 is referred to as higher portion hereinafter.

In some implementations, a protruding portion 5021 is positioned on the bottom surface 502*s*2 of the lower portion 502. The protruding portion 5021 may have a cylinder shape and extend from the bottom surface 502*s*2 of the lower portion 502. The protruding portion 5021 may be sized so that the protruding portion 5021 can be put in the positioning hole 136 in the installation state. A recess 5022 is formed on the top surface 502*s*1 and located above the protruding portion 5021. The recess 5022 may be a cylinder-shaped hole, and the size and shape of the recess 5022 may be substantially the same as those of the protruding portion 5021.

In some implementations, portion 504 may be connected between portions 502 and 506 and titled relative to both the portions 502 and 506. For example, the bottom surface 504*s*2 of portion 504 may start from zero elevation to the elevation h2 with respect to the bottom surface 502*s*2 of lower portion 502. For purposes of illustration, portion 504 is referred to as a tilting portion hereinafter.

Higher portion 506 may include a first segment 507 and a second segment 508. First segment 507 may extend from tilted portion 504, and second segment 508 may extend from first segment 507, as shown in FIGS. 5A to 5C. The width x4 of first segment 507 may be wider than the width x5 of second segment 508, as shown in FIG. 5B. The dimension of the adapter bracket 500 may be slightly smaller than that of the first portion 311 shown in FIG. 3C, so that the adapter bracket 500 can pass through the first portion 311 and the second portion 312 when placing the mainboard module 140 on the base plate 1301 of the chassis along the Y-axis direction.

In some implementations, a hole 5061 is formed on the higher portion 506. The hole 5061 may be a screw hole across first segment 507 and second segment 508. The hole 5061 has a upper side wall 5062 and a lower side wall 5063. The upper side wall 5062 is connected to the top surface 506*s*1, and it tilts inward from the top surface 506*s*1 to the lower side wall 5063, as shown in FIG. 5A. The lower side wall 5063 communicates with the upper side wall 5062 and is connected to the bottom surface 506*s*2. The elevation of the hole 5061 may be between a first elevation of the top surface 506*s*1 and a second elevation of the bottom surface 506*s*2 of higher portion 506 with respect to the bottom surface 502*s*2 of lower portion 502.

In some implementations, first segment 507 may include two shoulder portions 5064 and 5065 connected to side walls of higher portion 506. The shoulder portions 5064 and 5065 are configured to be substantially in contact with the mainboard mounting plate 120 so as to limit movement of the mainboard module 140 along the Z-axis direction (e.g., as shown in FIG. 1), the details of which will be described in the following embodiments.

Figure 6A:
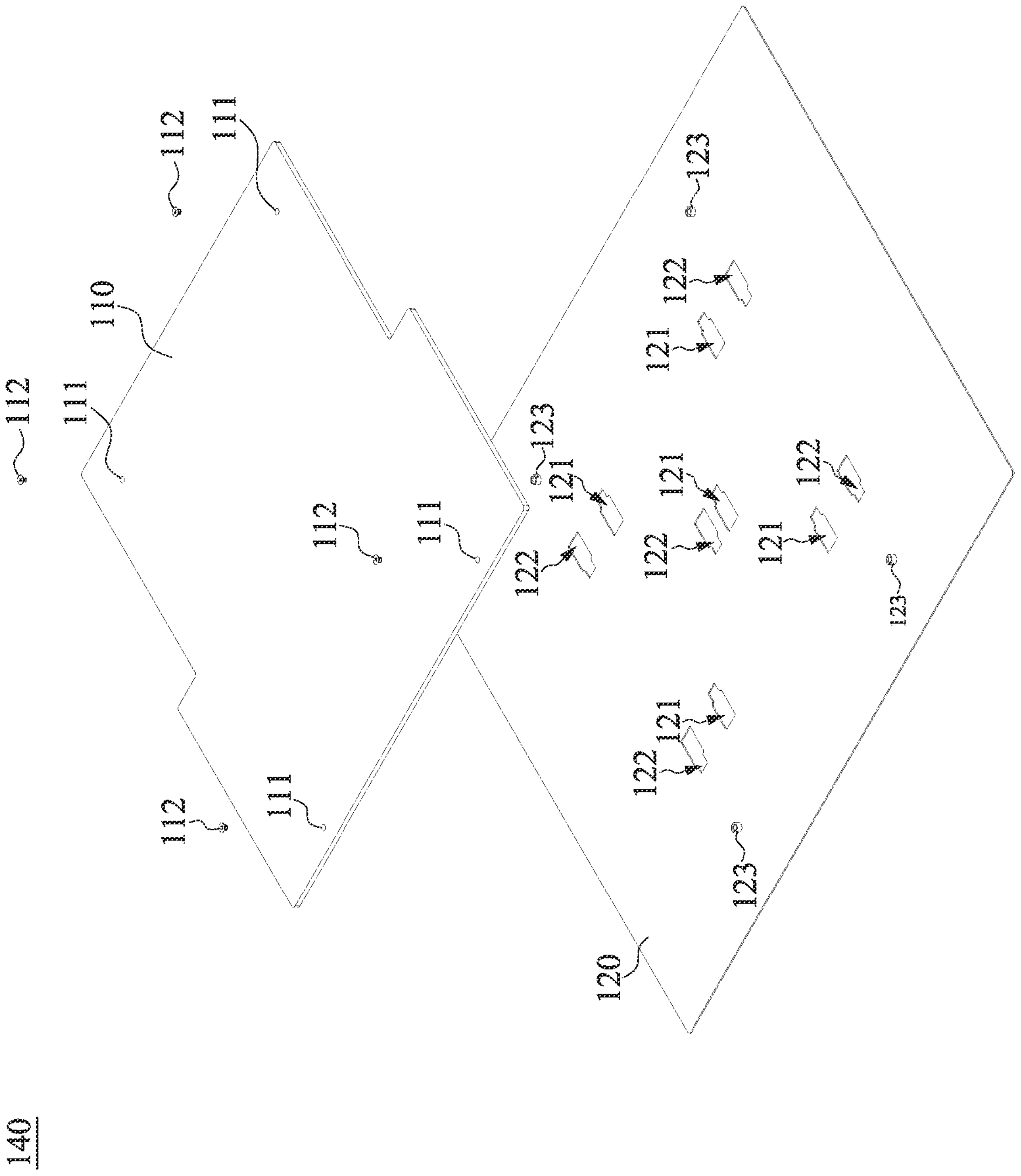
FIG. 6A is an exploded view of a mainboard module in accordance with an embodiment of the present disclosure.
Figure 6B:
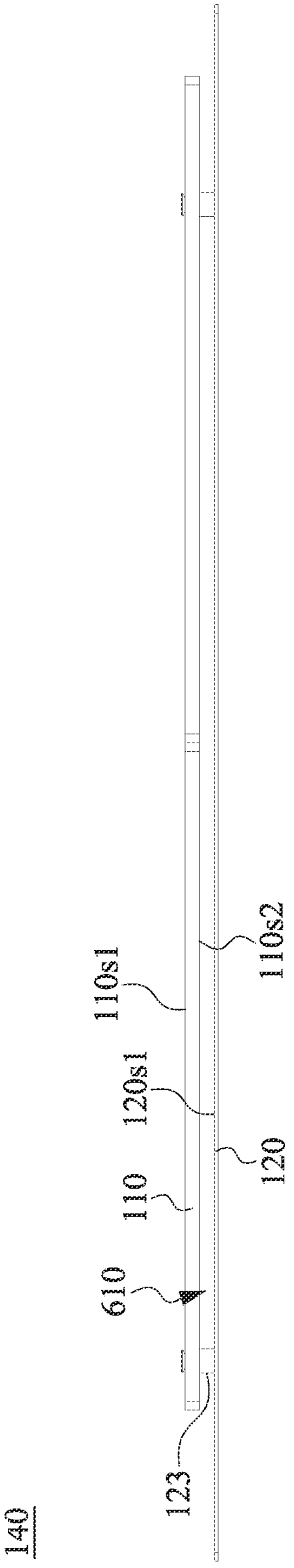
FIG. 6B is a side view of the mainboard module in FIG. 6A in accordance with an embodiment of the present disclosure.

FIG. 6A is an exploded view of the mainboard module 140 in accordance with an embodiment of the present disclosure. FIG. 6B is a side view of the mainboard module 140 in accordance with an embodiment of the present disclosure.

In some implementations, the mainboard 110 can be mounted to the mainboard mounting plate 120 via the fasteners 112, such as screws or bolts, through respective holes 111 on the mainboard 110 and respective nut members 123 disposed on the mainboard mounting plate 120 to form the mainboard module 140, as shown in FIG. 6A. It should be noted that the locations of the holes 111 on the mainboard 110 and the corresponding nut members 123 disposed on the mainboard mounting plate 120 may vary depending on the type and orientation of the mainboard 110 being used.

In some implementations, after the mainboard 110 has been mounted to the mainboard mounting plate 120, the bottom surface 110*s*2 of the mainboard 110 may be in contact with the nut members 123, and the top of the nut members 123 may have certain height with respect to the top surface 120*s*1 of the mainboard mounting plate 120, so there is a gap 610 between the bottom surface 110*s*2 of the mainboard 110 and the top surface 120*s*1 of the mainboard mounting plate 120. In some implementations, the height of the gap 610 may be approximately 3 mm, but the present disclosure is not limited thereto. The height of the gap 610 can vary based on the thickness of the mainboard 110.

Figure 7A:
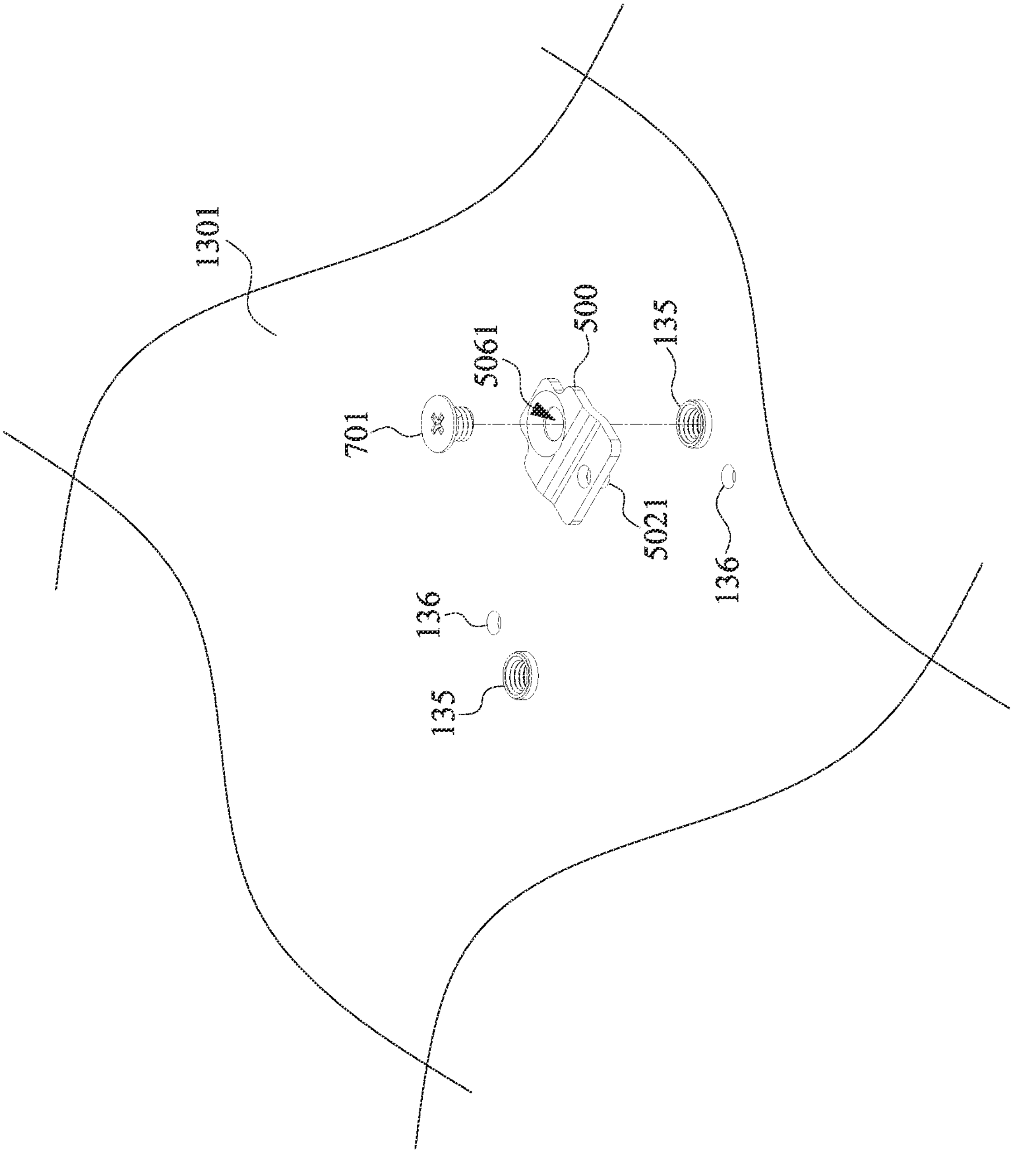
FIG. 7A is a perspective view illustrating installation of an adapter bracket on a chassis in accordance with an embodiment of the present disclosure.

FIG. 7A is a perspective view illustrating installation of the adapter bracket 500 on the chassis 130 in accordance with an embodiment of the present disclosure.

In some implementations, the adapter bracket 500 is mounted on the base plate 1301 of the chassis 130 prior to installation of the mainboard module 140 on the adapter bracket 500. The adapter bracket 500 is installed on the chassis 130 via the nut member 135 and the positioning hole 136. Specifically, as shown in FIG. 7A, to install the adapter bracket 500, the protruding portion 5021 of the adapter bracket 500 is first inserted into the positioning hole 136. With the positioning hole 136, the hole 5061 is aligned with the nut member 135, and a fastener 701 may be used to fix the adapter bracket 500 on the chassis 130 by passing through the hole 5061 of the adapter bracket 500 and the nut member 135 disposed on the lower portion of FIG. 7A. Here, the installation and removal of the mainboard module 140 may be performed by sliding the mainboard module 140 toward the negative direction and positive direction of the X-axis direction, respectively.

Figure 7B:
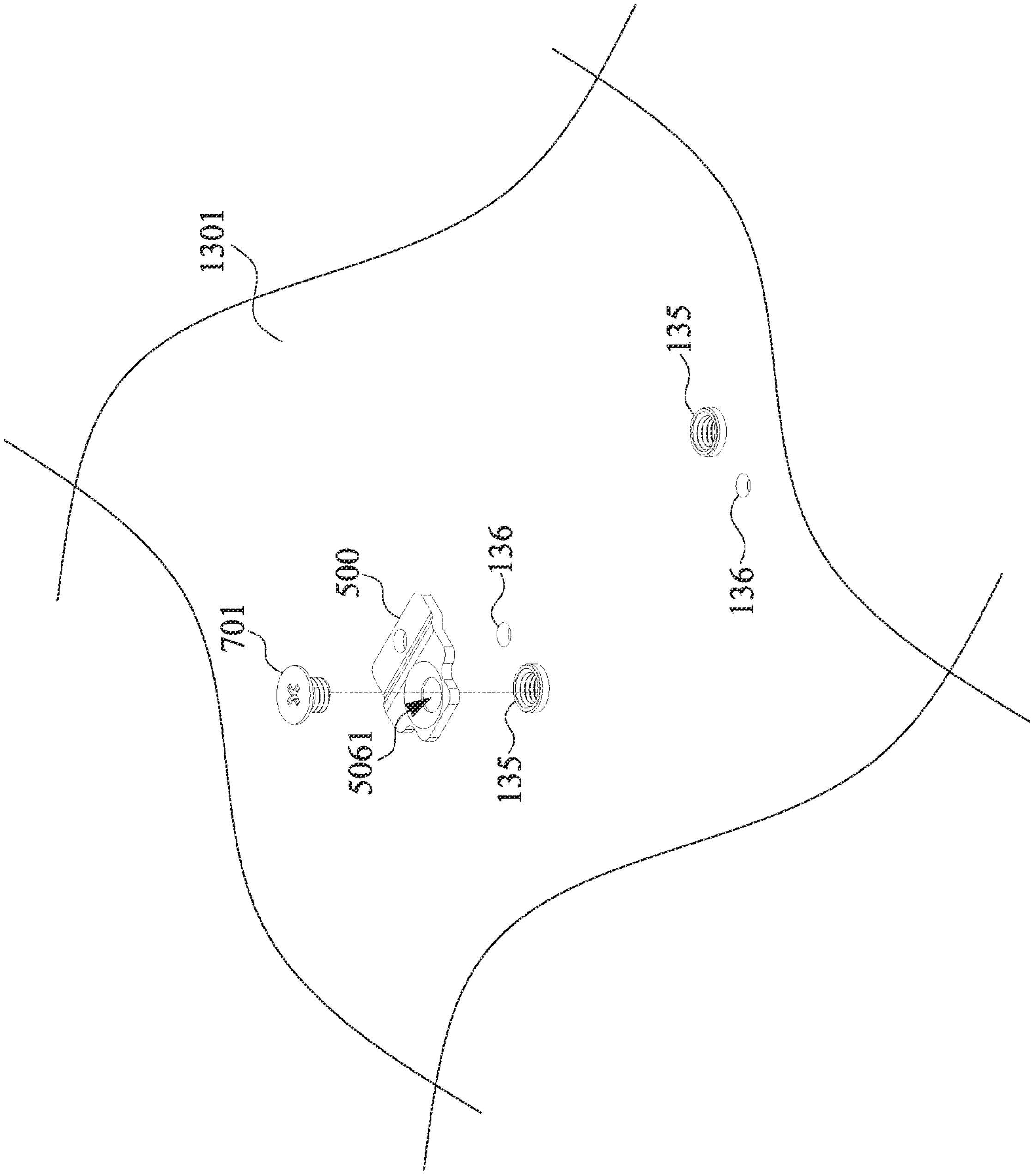
FIG. 7B is a perspective view illustrating installation of an adapter bracket on a chassis in accordance with another embodiment of the present disclosure.

FIG. 7B is a perspective view illustrating installation of the adapter bracket 500 on the chassis 130 in accordance with another embodiment of the present disclosure. In some other implementations, the adapter bracket 500 may be mounted to the base plate 1301 using the fastener 701 through the hole 5061 of the adapter bracket 500 and the nut member 135 disposed on the upper portion of FIG. 7B. In addition, the protruding portion of the adapter bracket 500 may be inserted into the positioning hole 136 next to the nut member 135 being used. Here, the installation and removal of the mainboard module 140 may be performed by sliding the mainboard module 140 toward the positive direction and negative direction of the X-axis direction, respectively.

Figure 8:
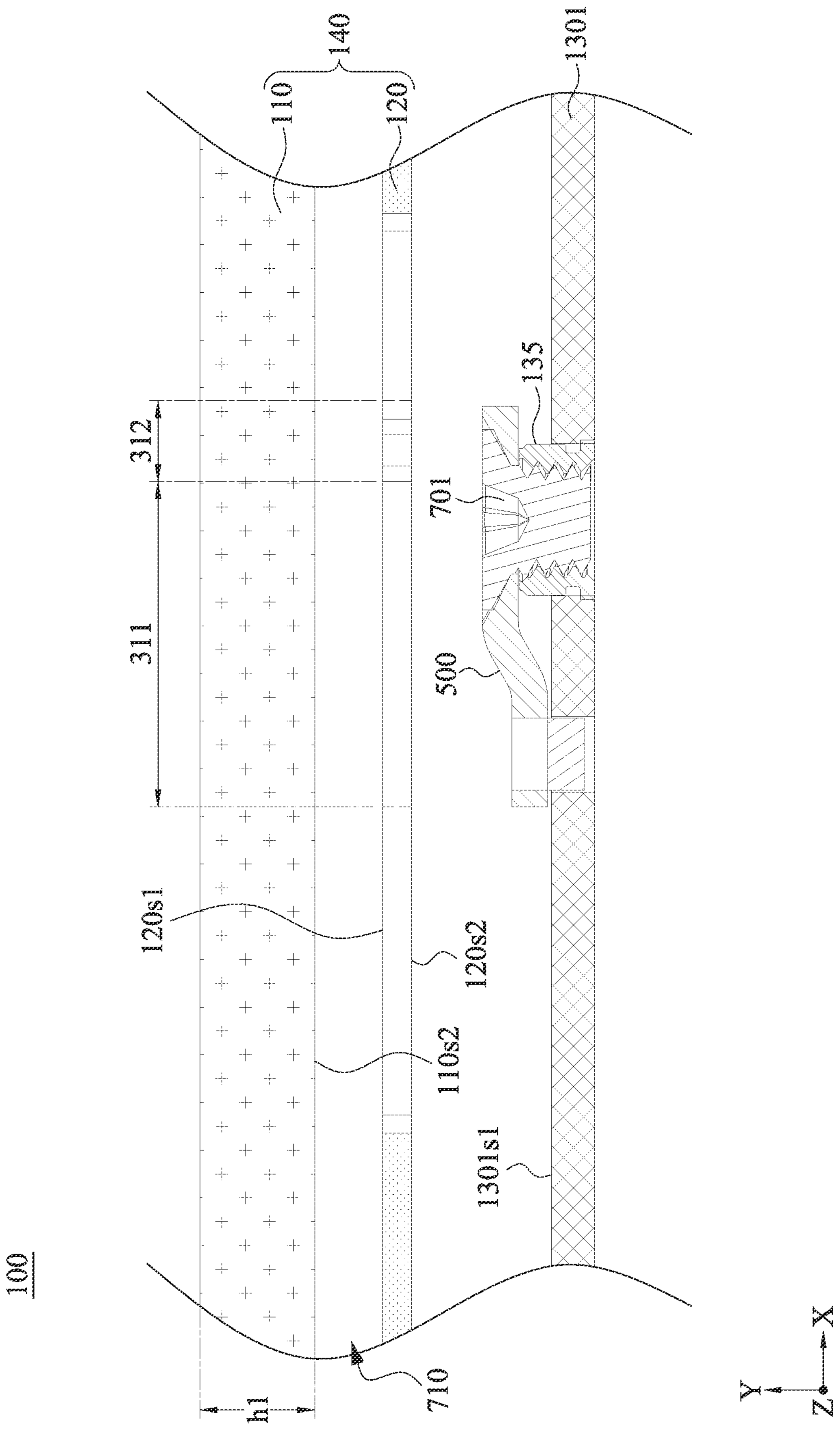
FIG. 8 is a side cross-sectional view of a server device illustrating a first operation of the installation procedure for a mainboard module in accordance with an embodiment of the present disclosure.
Figure 9A:
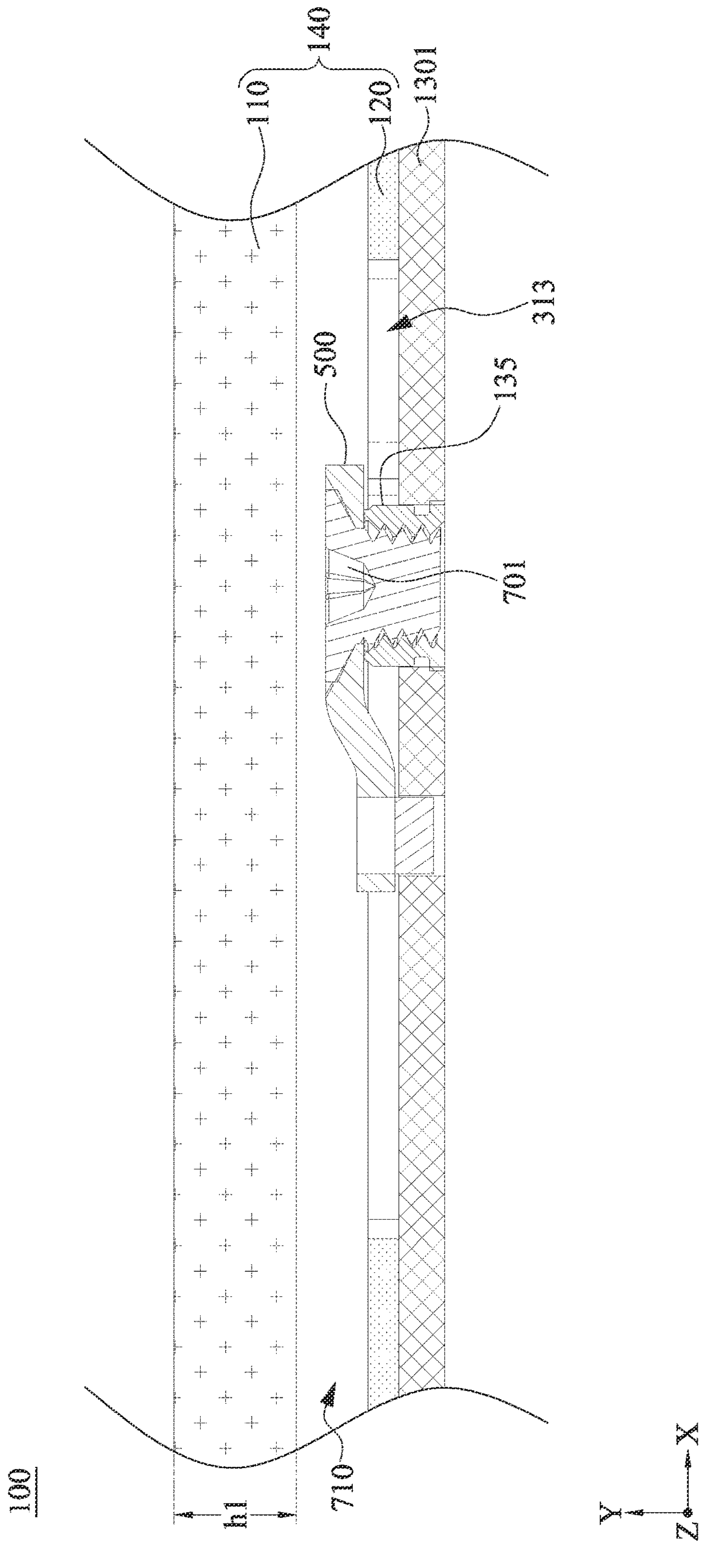
FIG. 9A is a side cross-sectional view of a server device illustrating a second operation of the installation procedure for a mainboard module in accordance with an embodiment of the present disclosure.
Figure 9B:
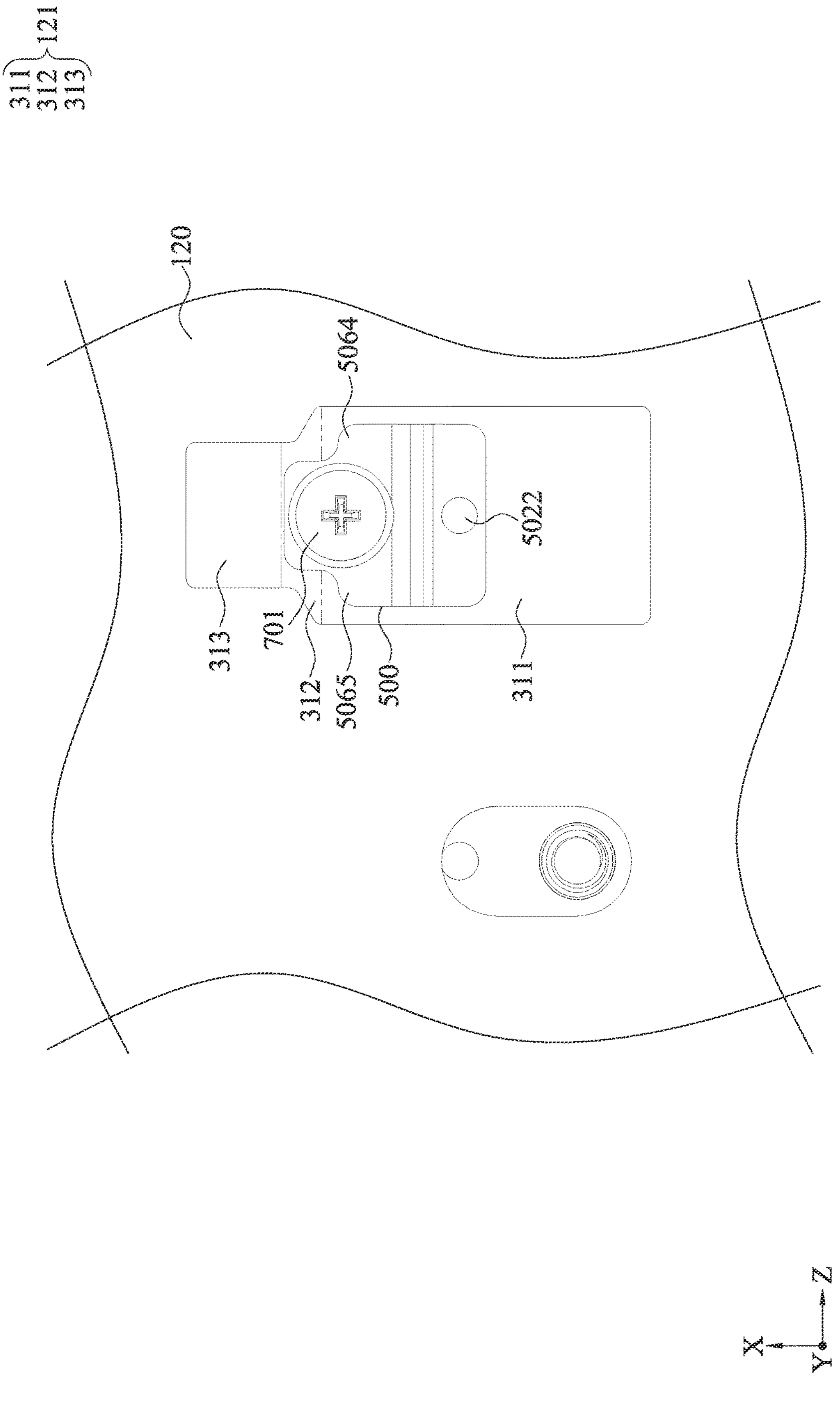
FIG. 9B is a top see-through view of the server device in FIG. 9A in accordance with an embodiment of the present disclosure.
Figure 10A:
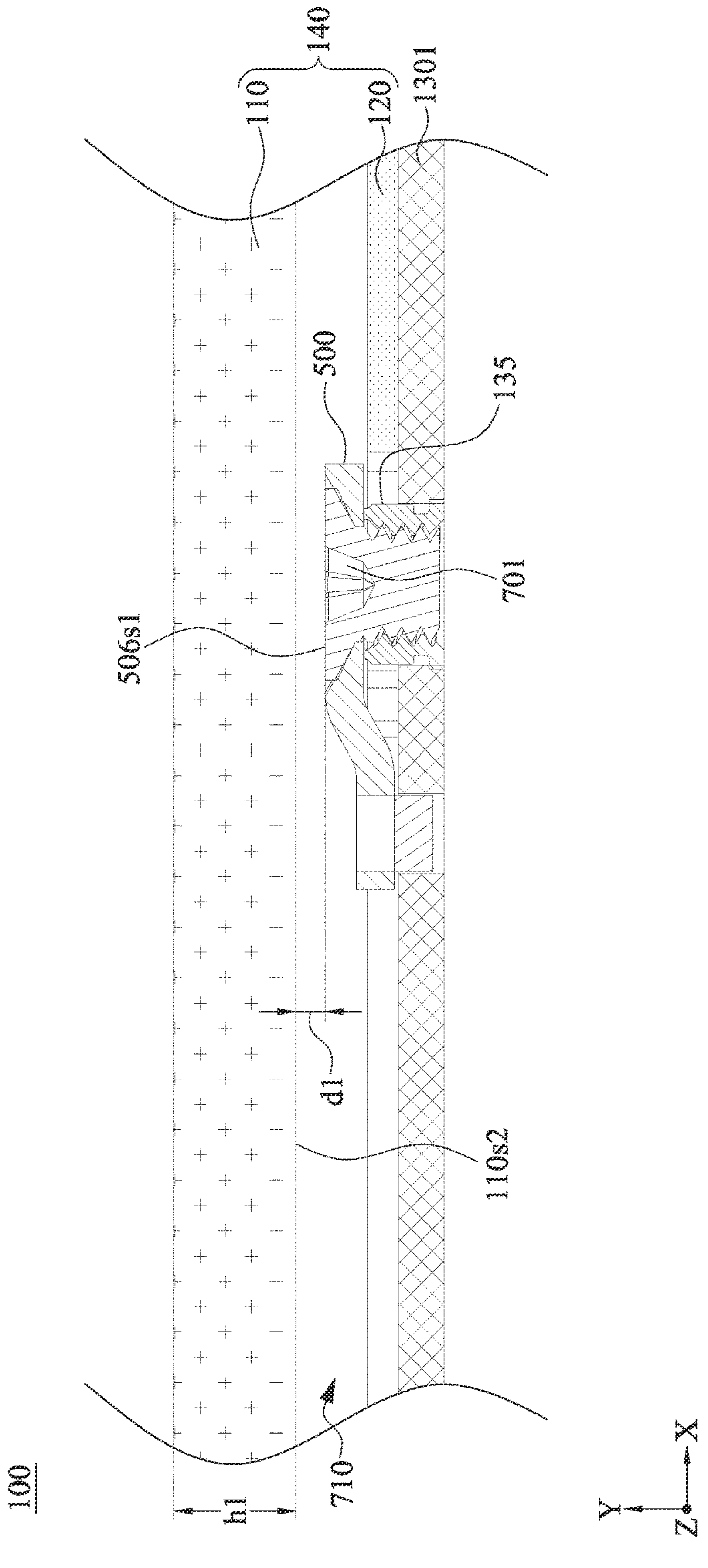
FIG. 10A is a side cross-sectional view of a server device illustrating a second operation of the installation procedure for a mainboard module in accordance with an embodiment of the present disclosure.
Figure 10B:
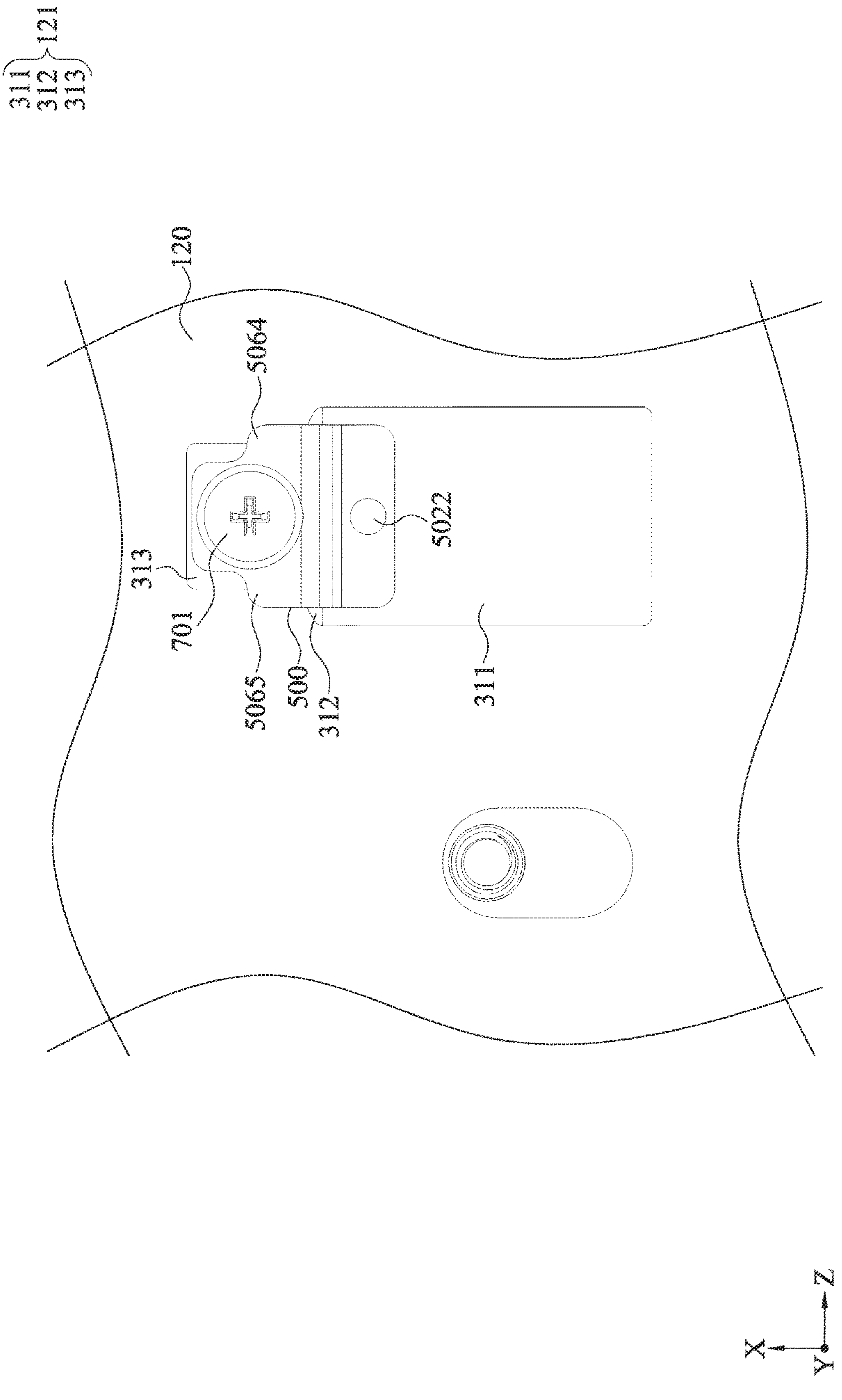
FIG. 10B is a top see-through view of the server device in FIG. 10A in accordance with an embodiment of the present disclosure.

FIG. 8 is a side cross-sectional view of a server device illustrating a first operation of the installation procedure for a mainboard module in accordance with an embodiment of the present disclosure. FIG. 9A is a side cross-sectional view of a server device illustrating a second operation of the installation procedure for a mainboard module in accordance with an embodiment of the present disclosure. FIG. 9B is a top see-through view of the server device in FIG. 9A. FIG. 10A is a side cross-sectional view of a server device illustrating a third operation of the installation procedure for a mainboard module in accordance with an embodiment of the present disclosure. FIG. 10B is a top see-through view of the server device in FIG. 10A.

In some implementations, to install the mainboard module 140 on the base plate 1301 of the chassis 130, the mainboard module 140 (i.e., mainboard 110 plus the mainboard mounting plate 120) is positioned above the adapter bracket 500 (e.g., a first operation), as depicted in FIG. 8. Then, the mainboard module 140 is moved downward along the Y-axis direction, so that the adapter bracket 500 passes through the first portion 311 and the second portion 312, and the bottom surface **120*s*2 of the mainboard mounting plate 120 is in contact with the top surface 1301*s*1 of the base plate 1301 of the chassis 130, as depicted in FIGS. 9A-9**B.

After the mainboard module 140 is placed on the adapter bracket 500, the mainboard module 140 can slide toward the negative direction of the X-axis direction, so that higher portion 506 enters the third portion 313 of the first hole 121, and the shoulder portions 5064 and 5065 of the adapter bracket 500 cover the top surface **120*s*1 of the mainboard mounting plate 120, as shown in FIGS. 10A and 10B, thereby limiting the movement of the mainboard module 140 along the Y-axis direction. In other words, the mainboard module 140 can be mounted to the chassis 130 via the adapter bracket 150 by sliding the mainboard module 140** along a first direction (e.g., positive direction or negative direction of the X-axis direction) perpendicular to a normal (e.g., Y axis) of a top surface of the chassis.

Figure 11:
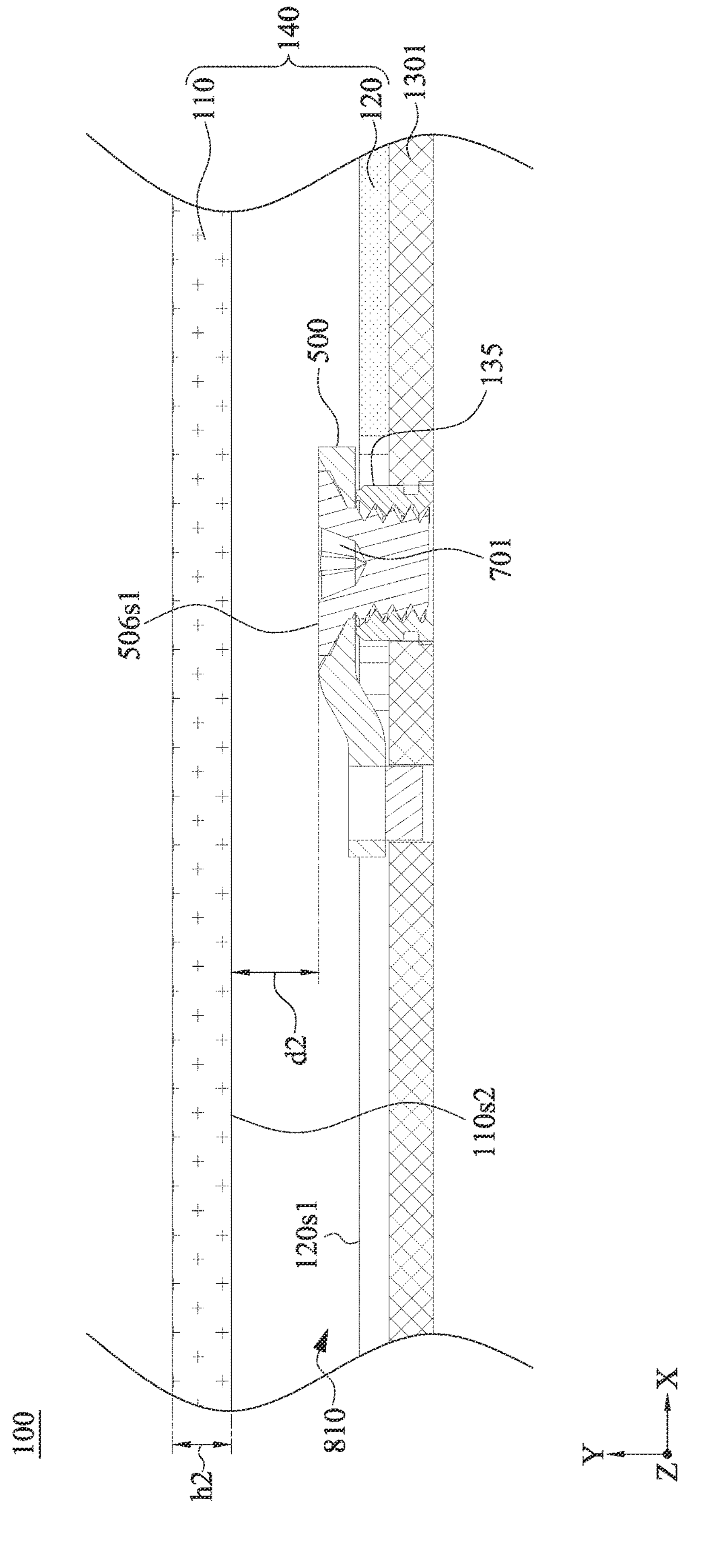
FIG. 11 is a side cross-sectional view of the server device illustrating the installation procedure for the mainboard module in accordance with another embodiment of the present disclosure.

FIG. 11 is a side cross-sectional view of the server device 100 illustrating the installation procedure of the mainboard module 140 in accordance with another embodiment of the present disclosure. Please refer to FIG. 10A and FIG. 11.

FIG. 11 is similar FIG. 10A, with the difference that the thickness h2 of the mainboard 110 shown in FIG. 11 is thinner than the thickness h1 of the mainboard 110 shown in FIG. 10A. More specifically, when the mainboard module 140 is assembled, the height of the gap 810 between the bottom surface **110*s*2 of the mainboard 110 and the top surface 120*s*1 of the mainboard mounting plate 120 may be fixed. When the mainboard 110 is thicker (e.g., height h1 shown in FIG. 10A) is used, the margin d1 (e.g. shown in FIG. 10A) between the bottom surface 120*s*2 of the mainboard mounting plate 120 and the top surface 506*s*1 of portion 506 of the adapter bracket 500 may be smaller, as shown in FIG. 10A. When the mainboard 110 is thinner (e.g., height h2 shown in FIG. 11), the margin d2 (e.g., shown in FIG. 11) between the bottom surface 120*s*2 of the mainboard mounting plate 120 and the top surface 506*s*1 of portion 506 of the adapter bracket 500 may be larger, as shown in FIG. 11**.

Specifically, the overall height of the mainboard module 140 (i.e., the height measured from the top surface **110*s*1 of the mainboard 110 to the bottom surface 120*s*2 of the mainboard mounting plate 120) may be fixed and meet a preset range defined by the OCP standard. In addition, the mainboard mounting plate 120 may be designed for mainboards of different sizes, shapes, and thickness, and the thickness of the mainboard mounting plate 120 is fixed. If the mainboard 110 is thicker, the gap 710 (e.g., shown in FIG. 9A) between the bottom surface 110*s*2 of the mainboard 110 and the top surface 120*s*1 of the mainboard mounting plate 120 is smaller, and the margin (e.g., d1) between the bottom surface of the mainboard mounting plate 120 and the top surface 506*s*1 of higher portion 506 of the adapter bracket 500 may become smaller, as depicted in FIG. 10A. If the mainboard 110 is thinner, the gap 810 (e.g., shown in FIG. 11) between the bottom surface 110*s*2 of the mainboard 110 and the top surface 120*s*1 of the mainboard mounting plate 120 is greater, and the margin (e.g., d2) between the bottom surface of the mainboard mounting plate 120 and the top surface 506*s*1 of higher portion 506 of the adapter bracket 500 may become larger, as depicted in FIG. 11**.

Therefore, the design of the adapter bracket 500 disposed on the chassis 130 may allow mainboard modules 140 of different thickness, sizes, types, and assembly orientation to be installed on the base plate 1301 of the chassis 130, thereby saving the cost incurred by mold making and improving the interoperability of the chassis 130.

While the present disclosure has been described with reference to specific embodiments, it is evident that many alternatives, modifications, and variations may be apparent to those skilled in the art. For example, various components of the embodiments may be interchanged, added, or substituted in other embodiments. Also, all of the elements of each figure are not necessary for operation of the disclosed embodiments. For example, one of ordinary skill in the art of the disclosed embodiments would be able to make and use the teachings of the present disclosure by simply employing the elements of the independent claims. Accordingly, embodiments of the present disclosure as set forth herein are intended to be illustrative, not limiting. Various changes may be made without departing from the spirit and scope of the present disclosure.

Even though numerous characteristics and advantages of the present disclosure have been set forth in the foregoing description, together with details of the structure and function of the invention, the disclosure is illustrative only. Changes may be made to details, especially in matters of shape, size, and arrangement of parts, within the principles of the invention to the full extent indicated by the broad general meaning of the terms in which the appended claims are expressed.

What is claimed is:

1. An adapter bracket, comprising:

a first portion, comprising a protruding portion extending from a first bottom surface of the first portion in a direction perpendicular to the first bottom surface;

a second portion, having an elevation with respect to the first bottom surface of the first portion, the second portion comprising a first hole; and a third portion, extending between the first portion and the second portion;

wherein the first portion further comprises a recess recessed from a top surface of the first portion along a direction normal to the top surface and located above the protruding portion;

wherein the protruding portion and the recess are vertically aligned with each other in a direction perpendicular to the top surface of the first portion;

wherein a planar area of a top surface of the first portion is greater than a planar area of the protruding portion and a planar area of the recess.

2. The adapter bracket of claim 1, wherein the first portion, the second portion, and the third portion substantially have a first thickness.

3. The adapter bracket of claim 2, wherein the first portion and the third portion have a first width.

4. The adapter bracket of claim 3, wherein the second portion comprises a first segment and a second segment, and the first segment has the first width, and the second segment has a second width narrower than the first width.

5. The adapter bracket of claim 4, wherein a first hole is disposed across the first segment and the second segment.

6. The adapter bracket of claim 5, wherein the first hole comprises:

an upper side wall, connected to a top surface of the second portion; and a lower side wall, communicating with the upper side wall and connected to a bottom surface of the second portion.

7. The adapter bracket of claim 5, wherein the upper side wall tilts inward from the top surface of the second portion to the lower side wall.

8. The adapter bracket of claim 1, wherein the protruding portion is cylinder-shaped.

9. An electronic device, comprising:

a chassis;

a mainboard module, comprising:

a mainboard mounting plate; and a mainboard, mounted to the mainboard mounting plate; and an adapter bracket, mounted on the chassis, wherein the mainboard module is mounted to the chassis via the adapter bracket by sliding the mainboard module along a first direction perpendicular to a normal of a first top surface of the chassis;

wherein the adapter bracket comprises:

a first portion, comprising a protruding portion extending from a first bottom surface of the first portion in a direction perpendicular to the first bottom surface;

a second portion, having an elevation with respect to the first bottom surface of the first portion, the second portion comprising a first hole; and a third portion, extending between the first portion and the second portion;

wherein the first portion further comprises a recess recessed from a top surface of the first portion along a direction normal to the top surface;

wherein the protruding portion and the recess are vertically aligned with each other in a direction perpendicular to the top surface of the first portion;

wherein a planar area of a top surface of the first portion is greater than a planar area of the protruding portion and a planar area of the recess.

10. The electronic device of claim 9, wherein the first portion, the second portion, and the third portion substantially have a first thickness.

11. The electronic device of claim 9, wherein the second portion comprises a first segment and a second segment, and the first segment has a first width, and the second segment has a second width narrower than the first width.

12. The electronic device of claim 11, wherein a first nut member and a positioning hole are disposed on the chassis, and the adapter bracket is mounted to the chassis by placing the protruding portion in the positioning hole and tightening a fastener through the first hole and the first nut member.

13. The electronic device of claim 12, wherein the mainboard mounting plate comprises a second hole having a first region, a second region, and a third region, and dimensions of the first region are larger than those of the adapter bracket.

14. The electronic device of claim 13, wherein the first region has a third width and a third length, and the third region has a fourth width and a fourth length, wherein the third width is greater than the fourth width, and the third length is longer than the fourth length, wherein the second region extends between the first region and the third region, and has a fifth length shorter than the fourth length.

15. The electronic device of claim 14, wherein when the mainboard module is placed on the adapter bracket, the adapter bracket passes through the first region and the second region, and a first bottom surface of the mainboard mounting plate is in contact with the first top surface of the chassis, and the second portion of the adapter bracket is entirely above the mainboard mounting plate with respect to the first top surface of the chassis.

16. The electronic device of claim 15, wherein the first portion of the adapter bracket comprises a first shoulder portion and a second shoulder portion on a first side neighboring to the second region.

17. The electronic device of claim 16, wherein when the mainboard module slides along the first direction perpendicular to the normal of the first top surface of the chassis, the first shoulder portion and the second shoulder portion cover at least a portion of the mainboard mounting plate to limit displacement of the mainboard module along a second direction parallel to the normal.

18. The electronic device of claim 17, wherein there is a margin between a bottom surface of the mainboard and a second top surface of the second portion of the adapter bracket.

* * * * *